(12) United States Patent
Chang et al.

(10) Patent No.: US 9,761,436 B2
(45) Date of Patent: Sep. 12, 2017

(54) MECHANISMS FOR FORMING PATTERNS USING MULTIPLE LITHOGRAPHY PROCESSES

(71) Applicant: Taiwan Semiconductor Manufacturing Company, Ltd., Hsin-Chu (TW)

(72) Inventors: Shih-Ming Chang, Hsinchu County (TW); Ming-Feng Shieh, Tainan County (TW); Chih-Ming Lai, Hsinchu (TW); Ru-Gun Liu, Hsinchu County (TW); Tsai-Sheng Gau, Hsinchu (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days.

(21) Appl. No.: 14/334,904

(22) Filed: Jul. 18, 2014

(65) Prior Publication Data

US 2015/0380261 A1    Dec. 31, 2015

Related U.S. Application Data

(60) Provisional application No. 62/019,127, filed on Jun. 30, 2014.

(51) Int. Cl.
*H01L 21/027* (2006.01)
*H01L 21/02* (2006.01)
(Continued)

(52) U.S. Cl.
CPC ........ *H01L 21/02071* (2013.01); *G03F 1/144* (2013.01); *G03F 7/70466* (2013.01);
(Continued)

(58) Field of Classification Search
None
See application file for complete search history.

(56) References Cited

U.S. PATENT DOCUMENTS 2,290,317 A    7/1942    Deakin
2,352,188 A    6/1944    Farrell
(Continued)

FOREIGN PATENT DOCUMENTS

JP    2006-189986    7/2006
JP    2005-293097    10/2015

OTHER PUBLICATIONS

U.S. Appl. No. 14/210,032, filed Mar. 13, 2014, by inventors Shih-Ming Chang, Ming-Feng Shieh, Chih-Ming Lai, Ru-Gun Liu, and Tsai-Sheng Gau for "Mechanisms for Forming Patterns Using Multiple Lithography Processes," 32 pages of text, 16 pages of drawings.
(Continued)

*Primary Examiner* — Jiong-Ping Lu
(74) *Attorney, Agent, or Firm* — Haynes and Boone, LLP

(57) ABSTRACT

The present disclosure provides a method for forming patterns in a semiconductor device. The method includes providing a substrate and a patterning-target layer over the substrate; patterning the patterning-target layer to form a main pattern; forming a middle layer over the patterning-target layer and a hard mask layer over the middle layer; patterning the hard mask layer to form a first cut pattern; patterning the hard mask layer to form a second cut pattern, a combined cut pattern being formed in the hard mask layer as a union of the first cut pattern and the second cut pattern; transferring the combined cut pattern to the middle layer; etching the patterning-target layer using the middle layer as an etching mask to form a final pattern in the patterning-target layer. In some embodiments, the final pattern includes
(Continued)

the main pattern subtracting an intersection portion between main pattern and the combined cut pattern.

19 Claims, 19 Drawing Sheets

(51) Int. Cl.

| | |
|---|---|
| *H01L 21/308* | (2006.01) |
| *G03F 7/20* | (2006.01) |
| *G03F 1/00* | (2012.01) |
| *H01L 29/66* | (2006.01) |
| *H01L 27/12* | (2006.01) |
| *H01L 21/84* | (2006.01) |
| *H01L 21/8234* | (2006.01) |
| *H01L 21/768* | (2006.01) |
| *H01L 21/3213* | (2006.01) |
| *H01L 21/311* | (2006.01) |
| *H01L 21/3065* | (2006.01) |
| *H01L 21/306* | (2006.01) |
| *H01L 21/302* | (2006.01) |
| *H01L 21/033* | (2006.01) |

(52) U.S. Cl.
CPC ........ *H01L 21/0337* (2013.01); *H01L 21/302* (2013.01); *H01L 21/308* (2013.01); *H01L 21/3065* (2013.01); *H01L 21/3086* (2013.01); *H01L 21/30621* (2013.01); *H01L 21/31144* (2013.01); *H01L 21/32139* (2013.01); *H01L 21/76816* (2013.01); *H01L 21/823431* (2013.01); *H01L 21/845* (2013.01); *H01L 27/1211* (2013.01); *H01L 29/66795* (2013.01)

(56) References Cited

U.S. PATENT DOCUMENTS

| | | | |
|---|---|---|---|
| 4,577,744 A | 3/1986 | Doucet | |
| 4,969,549 A | 11/1990 | Eglise | |
| 6,184,128 B1 | 2/2001 | Wang | |
| 6,328,902 B1 | 12/2001 | Hantschel | |
| 6,368,979 B1 | 4/2002 | Wang | |
| 6,383,952 B1 | 5/2002 | Subramanian | |
| 6,440,858 B1 | 8/2002 | Canale | |
| 6,472,315 B2 | 10/2002 | Nguyen | |
| 6,514,852 B2 | 2/2003 | Usami | |
| 6,534,809 B2 | 3/2003 | Moise | |
| 6,550,600 B2 | 4/2003 | Faes et al. | |
| 6,605,545 B2 | 8/2003 | Wang | |
| 6,835,662 B1 | 12/2004 | Erhardt | |
| 6,930,036 B2 | 8/2005 | Usami | |
| 7,057,286 B2 | 6/2006 | Usami | |
| 7,074,527 B2 | 7/2006 | Lu | |
| 8,039,179 B2 | 10/2011 | Shieh et al. | |
| 8,202,681 B2 | 6/2012 | Lin et al. | |
| 8,609,495 B2 | 12/2013 | Gan | |
| 8,647,521 B2 | 2/2014 | Jung | |
| 8,728,332 B2 | 5/2014 | Lin et al. | |
| 8,822,243 B2 | 9/2014 | Yan et al. | |
| 8,835,323 B1 | 9/2014 | Shieh | |
| 8,987,142 B2 | 3/2015 | Lee et al. | |
| 9,159,560 B2 | 10/2015 | Seo | |
| 2002/0187629 A1 | 12/2002 | Huang | |
| 2005/0064299 A1 | 3/2005 | Lu | |
| 2005/0208742 A1 | 9/2005 | America | |
| 2006/0091468 A1 | 5/2006 | Liaw | |
| 2006/0211260 A1* | 9/2006 | Tran | H01L 21/0337 438/763 |
| 2010/0224942 A1 | 9/2010 | Lim | |
| 2011/0281208 A1 | 11/2011 | Lin et al. | |
| 2012/0225388 A1* | 9/2012 | Umatate | G03F 7/70466 430/322 |
| 2012/0278776 A1 | 11/2012 | Lei et al. | |
| 2013/0105918 A1 | 5/2013 | Mieno | |
| 2013/0295769 A1 | 11/2013 | Lin et al. | |
| 2013/0320451 A1 | 12/2013 | Liu et al. | |
| 2014/0193974 A1 | 7/2014 | Lee et al. | |
| 2014/0215421 A1 | 7/2014 | Chen et al. | |
| 2014/0242794 A1 | 8/2014 | Lin et al. | |
| 2014/0264760 A1 | 9/2014 | Chang et al. | |
| 2014/0264899 A1 | 9/2014 | Chang et al. | |
| 2014/0273442 A1 | 9/2014 | Liu et al. | |
| 2014/0273446 A1 | 9/2014 | Huang et al. | |
| 2015/0380256 A1 | 12/2015 | Chang | |

OTHER PUBLICATIONS

U.S. Appl. No. 62/019,100, filed on Jun. 30, 2014, by inventors Shih-Ming Chang for "Mechanisms for Forming Patterns Using Multiple Lithography Processes," 29 pages of text, 12 pages of drawings.

U.S. Appl. No. 62/019,127, filed Jun. 30, 2014, by inventors Shih-Ming Chang, Ming-Feng Shieh, Chih-Ming Lai, Ru-Gun Liu, and Tsai-Sheng Gau for "Mechanisms for Forming Patterns Using Multiple Lithography Processes," 40 pages of text, 19 pages of drawings.

U.S. Appl. No. 14/334,958, filed Jul. 18, 2014, by inventors Shih-Ming Chang for "Mechanisms for Forming Patterns Using Multiple Lithography Processes," 30 pages of text, 11 pages of drawings.

* cited by examiner

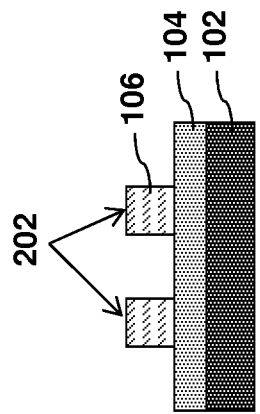
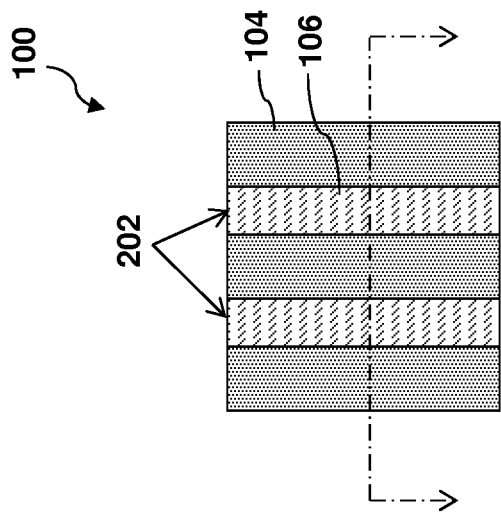
FIG. 2A
FIG. 2B
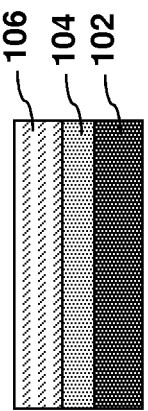
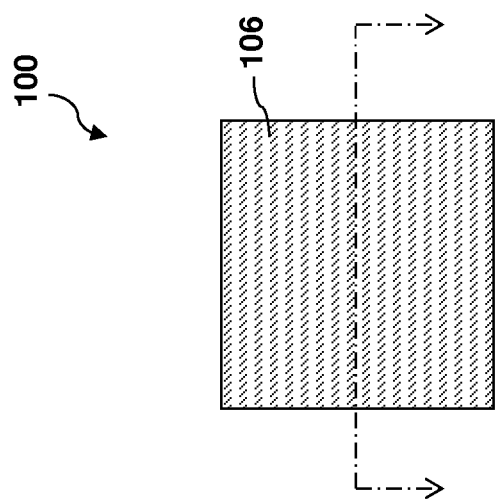
FIG. 1A
FIG. 1B

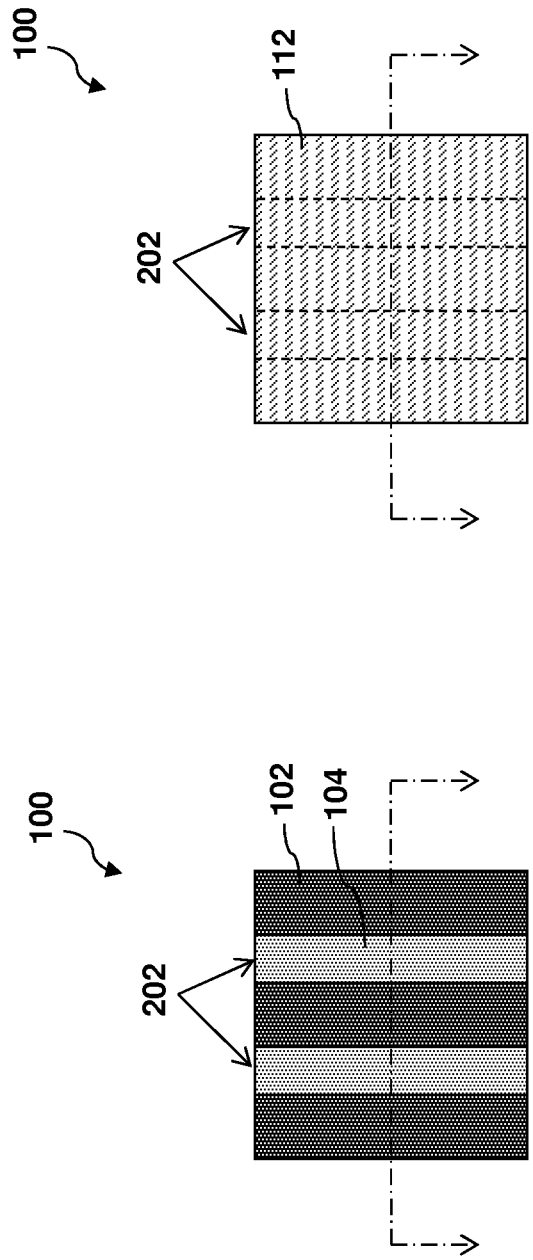

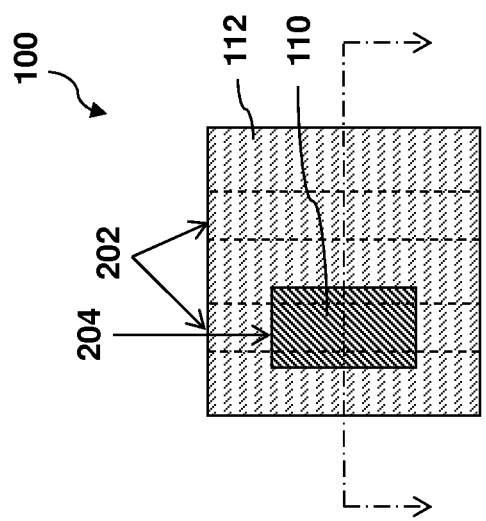
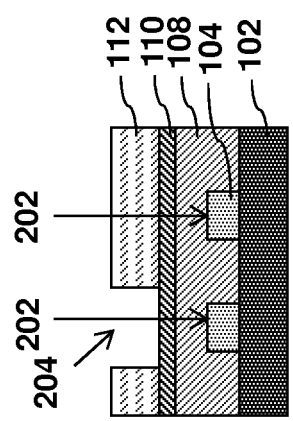
FIG. 5A
FIG. 5B
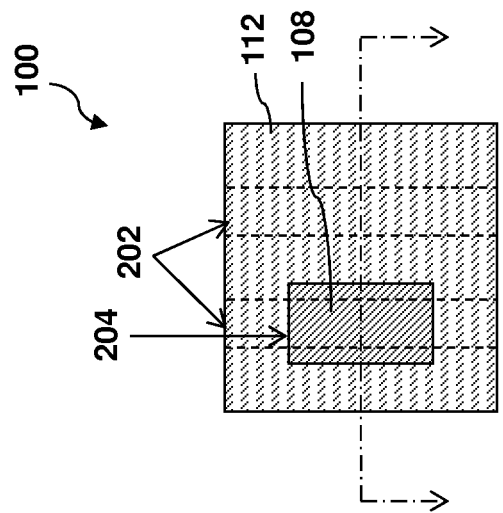
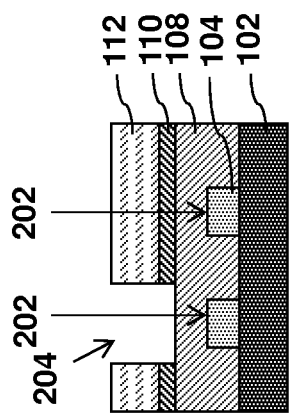
FIG. 6A
FIG. 6B

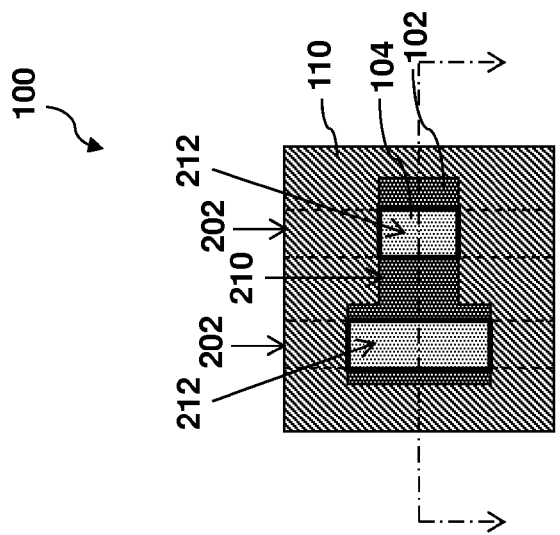
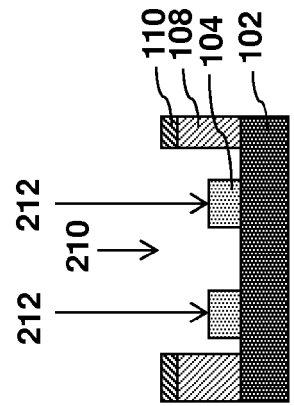
FIG. 12A
FIG. 12B
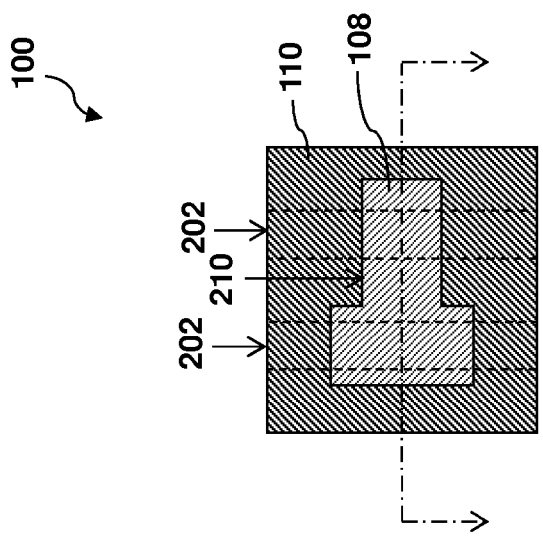
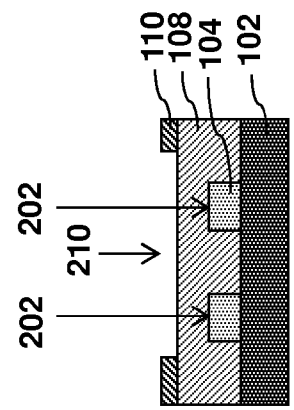
FIG. 11A
FIG. 11B

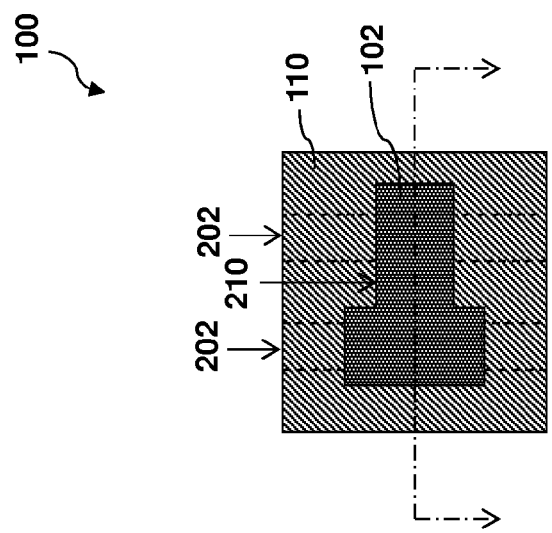
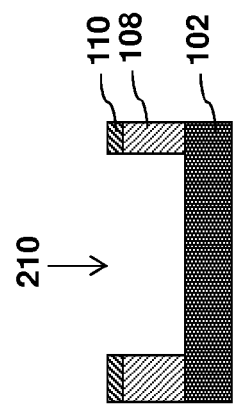
FIG. 13A  FIG. 13B
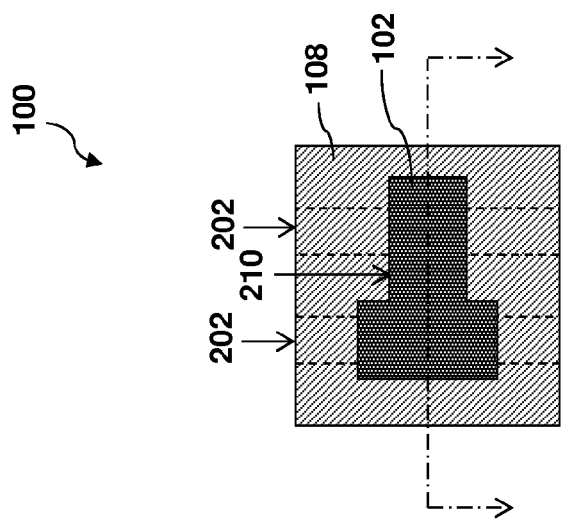
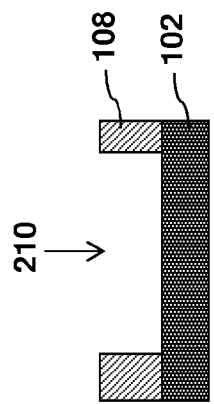
FIG. 14A  FIG. 14B

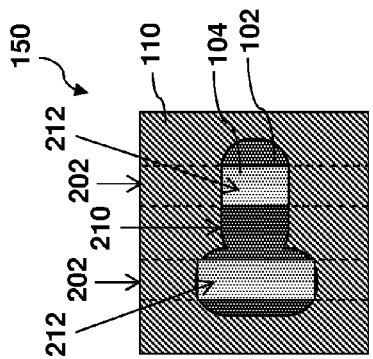
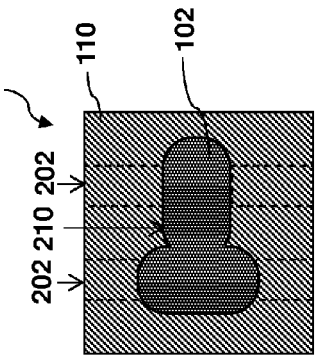
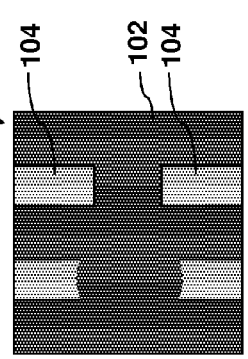
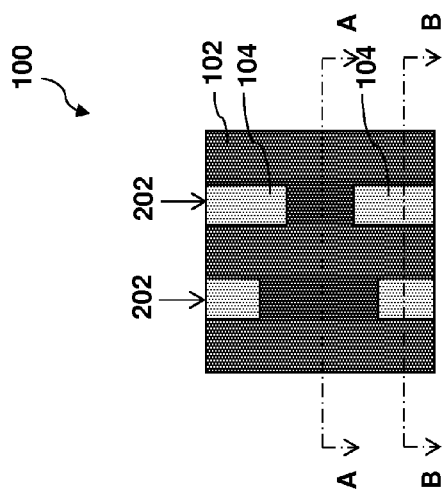
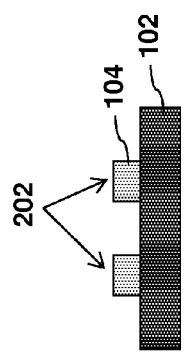

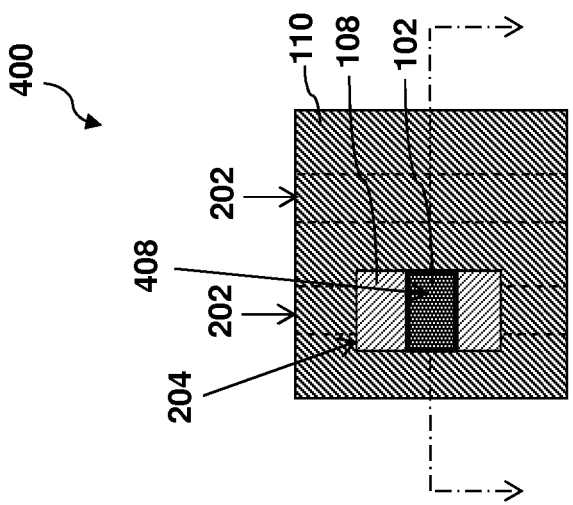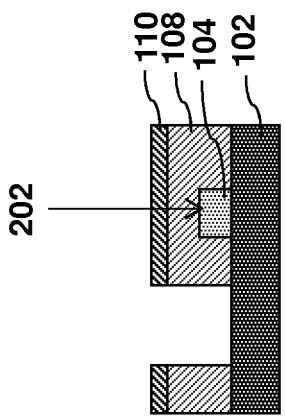
FIG. 21A
FIG. 21B
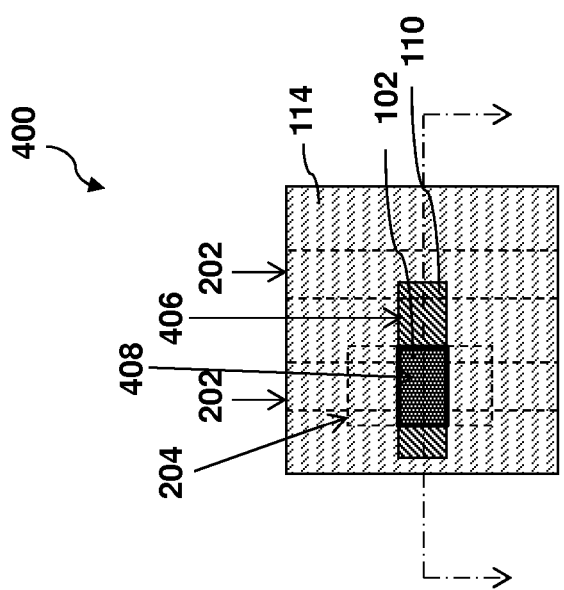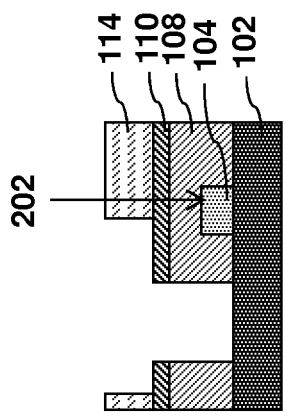
FIG. 20A
FIG. 20B

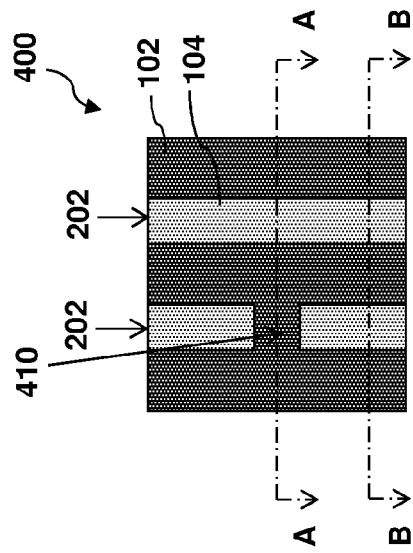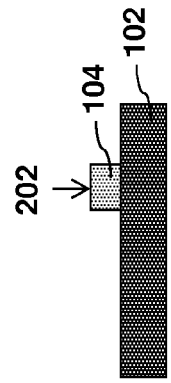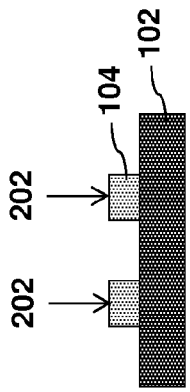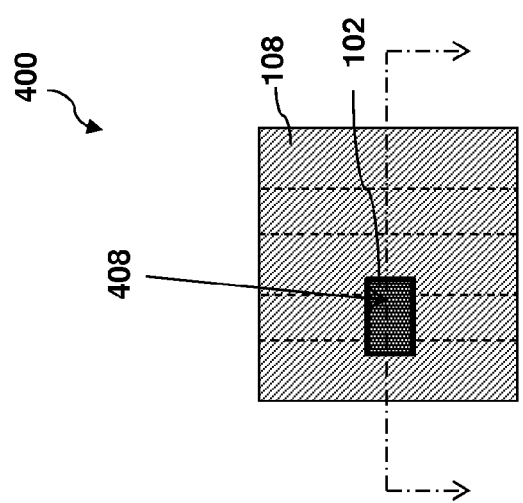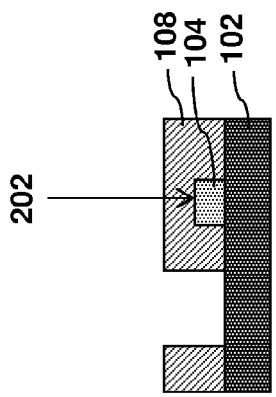

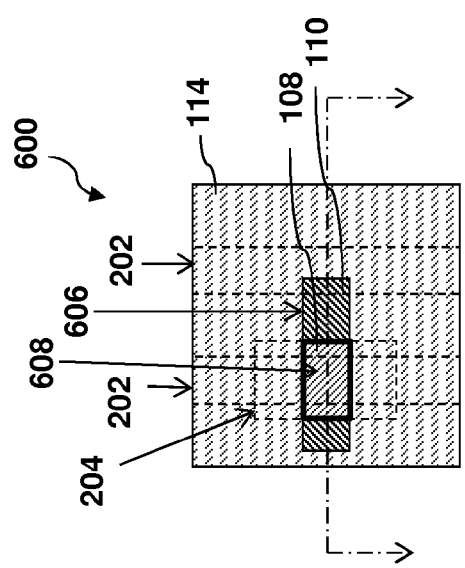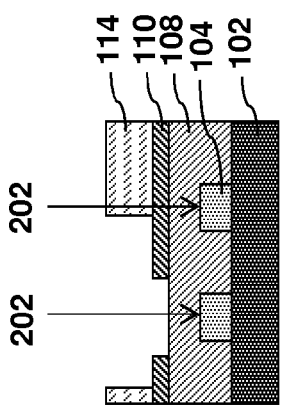
FIG. 25A
FIG. 25B
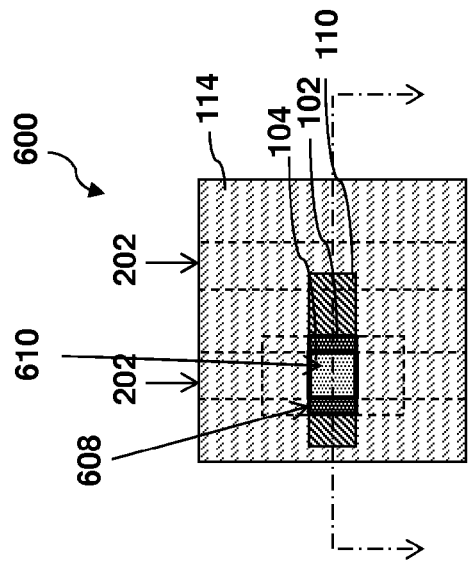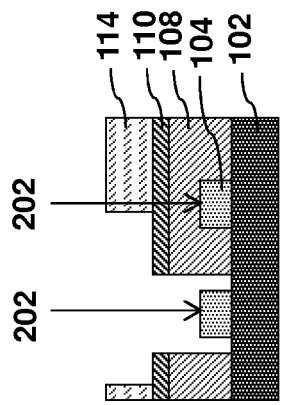
FIG. 26A
FIG. 26B

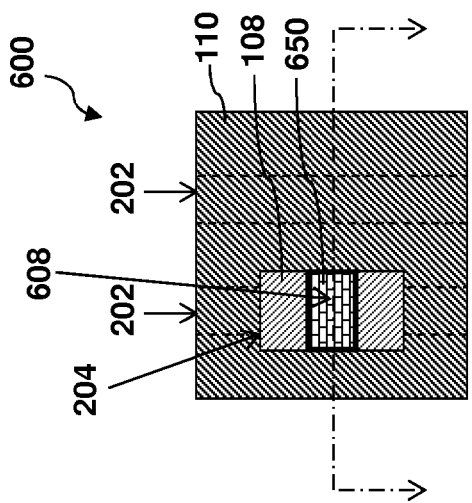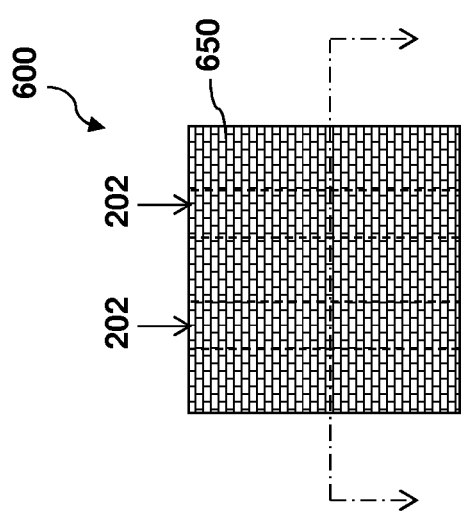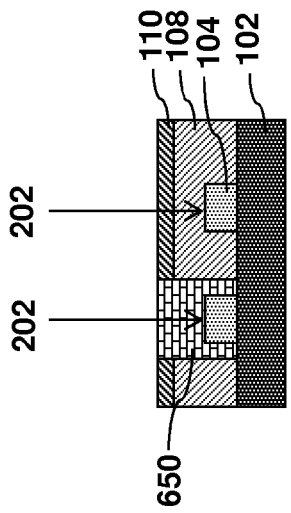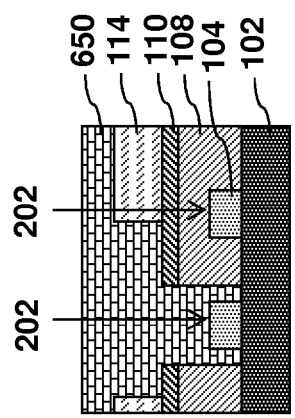

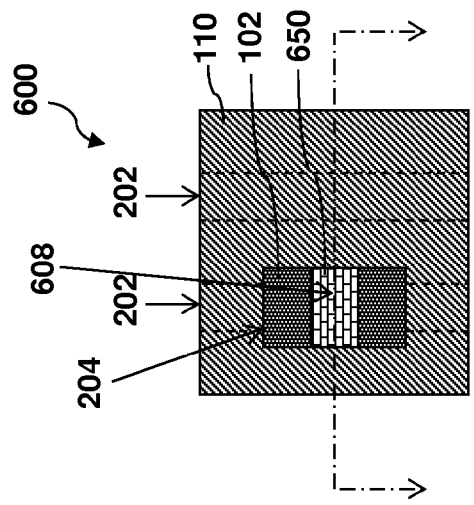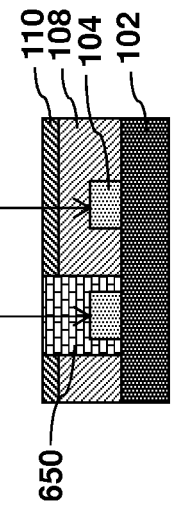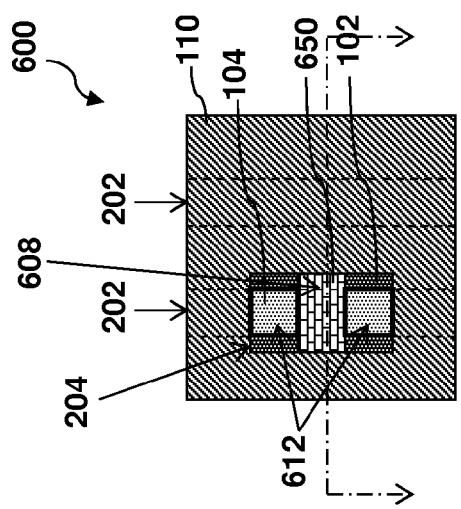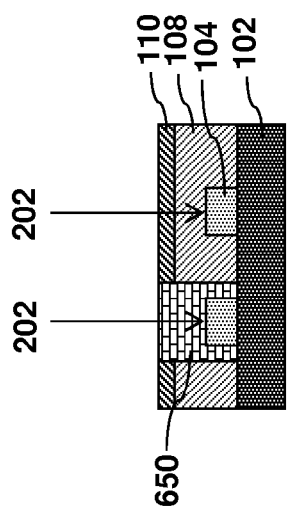

4p. Remove ML and get final pattern on Target film. Done!

MECHANISMS FOR FORMING PATTERNS USING MULTIPLE LITHOGRAPHY PROCESSES

This application claims priority to U.S. Provisional Patent Application Ser. No. 62/019,127, filed on Jun. 30, 2014, the entire disclosure of which is hereby incorporated herein by reference.

BACKGROUND

The present disclosure is related to the following commonly-assigned patent applications, the entire disclosures of which are incorporated herein by reference: U.S. Provisional Patent Application Ser. No. 62/019,100 filed on Jun. 30, 2014, entitled "Mechanisms for Forming Patterns Using Multiple Lithography Processes", and U.S. patent application Ser. No. 14/210,032 filed on Mar. 13, 2014, entitled "Mechanisms for Forming Patterns Using Multiple Lithography Processes".

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed.

In the course of these benefits, efforts have been made to develop fabrication methods to realize the desire for smaller feature sizes. For example, methods have been developed to reduce the pitch of features on a substrate without changing the photolithography technology used. However, current methods have not been satisfactory in all respects. For example, process windows of critical dimension (CD) uniformity control and process flexibility of forming special features may be not sufficient.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A, 2A, 3A, 4A, 5A, 6A, 7A, 8A, 9A, 10A, 11A, 12A, 13A, 14A, and 15A are top views of the semiconductor structure at various fabrication stages constructed according to the method of FIG. 17, in accordance with some embodiments.

FIGS. 1B, 2B, 3B, 4B, 5B, 6B, 7B, 8B, 9B, 10B, 11B, 12B, 13B, and 14B are cross sectional views of the semiconductor structure along the dash lines of FIGS. 1A, 2A, 3A, 4A, 5A, 6A, 7A, 8A, 9A, 10A, 11A, 12A, 13A, and 14A respectively, in accordance with some embodiments.

FIGS. 15B-15C are cross sectional views of the semiconductor structure along the dash lines A-A and B-B of FIG. 15A respectively, in accordance with some embodiments.

FIGS. 16A-16C are top views of the semiconductor structure including features with complex shapes at various fabrication stages constructed according to the method of FIG. 17, in accordance with some embodiments.

FIGS. 18A, 19A, 20A, 21A, 22A, and 23A are top views of the semiconductor structure at various fabrication stages constructed according to the method of FIG. 24 after forming the structure of FIGS. 8A-8B, in accordance with some embodiments.

FIGS. 18B, 19B, 20B, 21B, and 22B are cross sectional views of the semiconductor structure along the dash lines of FIGS. 18A, 19A, 20A, 21A, and 22A respectively, in accordance with some embodiments.

FIGS. 23B-23C are cross sectional views of the semiconductor structure along the dash lines A-A and B-B of FIG. 23A respectively, in accordance with some embodiments.

FIGS. 25A, 26A, 27A, 28A, 29A, 30A, 31A, 32A, and 33A and are top views of the semiconductor structure at various fabrication stages constructed according to the method of FIG. 35 after forming the structure of FIGS. 8A-8B, in accordance with some embodiments.

FIGS. 25B, 26B, 27B, 28B, 29B, 30B, 31B, 32B, and 33B are cross sectional views of the semiconductor structure along the dash lines of FIGS. 25A, 26A, 27A, 28A, 29A, 30A, 31A, 32A, and 33A respectively, in accordance with some embodiments.

DETAILED DESCRIPTION

Figure 7A:
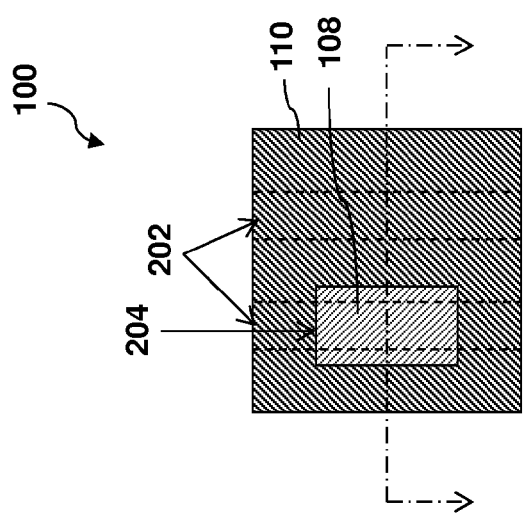

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Due to the limitations from the optics, resist materials, developing and/or etching techniques during the lithography patterning process, the developed pattern may not be able to include a feature with a size under the minimum constraints, such as a minimum line width. The developed pattern may also not be able to have dense feature(s) that are disposed from an adjacent feature for less than about a minimum pitch value. As obtained from a single lithography process, the developed pattern may have limitations on the complexity of the shapes. In addition, after exposing and developing, the pattern may have "rounding issues", where the edges and/or the corners of the features may appear to be round and/or unclear, instead of being sharp and clear as expected. In some embodiments, the mechanisms discussed in the present disclosure can solve the above listed problems, and provide one or more semiconductor structures having complex shapes and free of the "rounding issues".

As illustrated in FIGS. 1A-1B, a substrate 102, patterning-target layer 104, and a first photoresist layer 106 are provided in a semiconductor structure 100. In some embodiments, the substrate 102 is a semiconductor substrate, such as a semiconductor wafer. The substrate 102 may include silicon in a crystalline structure. In some embodiments, the substrate 102 may include other elementary semiconductor, such as germanium; a compound semiconductor including silicon germanium, silicon carbide, gallium arsenide, indium arsenide, indium phosphide, and/or indium antimonide; an alloy semiconductor including SiGe, GaAsP, AlInAs, AlGaAs, GaInAs, GaInP, and/or GaInAsP; or combinations thereof. In some embodiments, the substrate 102 may be a silicon-on-insulator (SOI) substrate. The substrate 102 may further include additional features and/or material layers, such as various isolation features formed in the substrate. In some embodiments, the substrate 102 may include various doped regions, such as p-type doped regions and/or n-type doped regions configured and coupled to form various devices and functional features. All doping features may be achieved using a suitable process, such as ion implantation in various steps and techniques. In some embodiments, the substrate 102 may include other features, such as shallow trench isolation (STI). The substrate 102 may further include various material layers, such as gate material layers.

Referring to FIG. 1B, the patterning-target layer 104 is formed over the substrate 102. In some embodiments, the patterning-target layer 104 is the layer where the final patterns are formed over the substrate 102. In some embodiments, the patterning-target layer 104 has a thickness in a range from about 5 nm to about 50 nm. In some embodiments, the patterning-target layer 104 is formed using one or more conventional processes known in the art such as, chemical vapor deposition (CVD), spin-on methods, sputtering, oxidation, physical vapor deposition (PVD), atomic layer deposition (ALD), atomic layer CVD (ALCVD), thermal oxidation, and/or other suitable processes. In some embodiments, the patterning-target layer 104 includes one or more dielectric materials, such as silicon oxide ($SiO_2$), and/or silicon nitride ($Si_3N_4$). In some embodiments, the patterning-target layer 104 also includes metallic materials. In some embodiments, the patterning-target layer 104 is an upper portion of the substrate 102.

Still referring to FIG. 1B, in order to pattern the patterning-target layer 104, the first resist layer 106 is formed over the patterning-target layer 104. In some embodiments, the first resist layer 106 is a photoresist layer including chemicals that are sensitive to light, such as UV light. In some embodiments, the first resist layer 106 can also be an electron-beam sensitive layer. In some embodiments, the first resist layer 106 is formed using a spin-on coating method. In some embodiments, the first resist layer 106 includes one or more organic polymer materials. In some embodiments, the first resist layer 106 has a thickness in a range from about 10 nm to about 100 nm.

Referring to FIGS. 2A-2B, a lithography process is performed to the first resist layer 106 to form a main pattern 202. In some embodiments, the main pattern 202 includes one or more lines 202 as shown in FIG. 2A. In some embodiments, the main pattern 202 is formed in the first resist layer 106 using a lithography process. In some embodiments, the lithography process starts from exposing the first resist layer 106 to a light source using a mask having the main pattern 202. The lithography process also includes performing post-exposure bake processes, and developing the first resist layer 106 to form a patterned first resist layer, so that the main pattern 202 can be formed in the first resist layer 106 as shown in FIGS. 2A-2B. In some embodiments, the main pattern 202 may include any other suitable features that can be formed using a lithography process. In some embodiments, a lithography process may further include other operations, such as soft baking and/or hard baking. In some embodiments, the lithography process may alternatively employ other suitable technology, such as electron-beam direct writing.

Referring to FIGS. 3A-3B, the patterned first resist layer 106 is used as an etching mask to transfer the main pattern 202 to the patterning-target layer 104. In some embodiments, the regions that are not covered by the patterned first resist layer 106 are removed using one or more etching processes, leaving the region(s) corresponding to the main pattern 202 remain in the patterning-target layer 104 as shown in FIGS. 3A-3B. In some embodiments, the one or more etching processes include a selective dry etch process, such as a plasma etching process, a selective wet etching process, or a combination thereof. In some embodiments, the etching process includes using etching gases including at least one of carbon tetrafluoride ($CF_4$), difluoromethane ($CH_2F_2$), trifluoromethane ($CHF_3$), other suitable etching gases, or combinations thereof.

After transferring the first pattern 202 to the patterning-target layer 104, the first resist layer 106 is removed. In some embodiments, the first resist layer 106 is removed by a wet stripping process, a plasma ashing process, other suitable methods, and/or combinations thereof. In some embodiments, the plasma ashing process includes using gases including at least one of oxygen ($O_2$), carbon dioxide ($CO_2$), nitrogen ($N_2$), hydrogen ($H_2$), or combinations thereof. As shown in FIG. 3B, the first pattern 202 is exposed in the patterning-target layer 104 after removing the first resist layer 106.

Referring to FIGS. 4A-4B, a film stack 107 is formed over the patterning-target layer 104. In some embodiments, the film stack 107 includes a middle layer 108 formed over the patterning-target layer 104 and the substrate 102, a hard mask layer 110 formed over the middle layer 108, and a second resist layer 112 formed over the hard mask layer 110.

Referring to FIG. 4B, the middle layer 108 is formed to cover both the patterning-target layer 104 and the substrate 102, and to provide a planar top surface. In some embodiments, the middle layer 108 is formed to transfer one or more patterns formed in the subsequent processes to the main pattern in the patterning-target layer 104 as discussed later in the present disclosure. In some embodiments, the middle layer 108 includes one or more polymers including silicon. In some embodiments, the middle layer 108 has a thickness in a range from about 10 nm to about 100 nm. In some embodiments, the middle layer 108 is formed using a spin-on coating method and/or a suitable deposition method.

Still referring to FIG. 4B, the hard mask layer 110 is formed to transfer one or more patterns formed in the subsequent processes to the middle layer 108 as discussed later in the present disclosure. In some embodiments, the hard mask layer 110 includes one or more dielectric materials, such as silicon oxide, silicon nitride, and/or silicon oxynitride (SiON). In some embodiments, the hard mask layer 110 includes titanium nitride (TiN). In some embodiments, the hard mask layer 110 has a thickness in a range from about 5 nm to about 50 nm. In some embodiments, the hard mask layer 110 is formed using one or more processes selected from the group consisting of CVD, PVD, ALD, spin-on method, sputtering, thermal oxidation, and a combination thereof.

Still referring to FIG. 4B, the second resist layer 112 is formed over the hard mask layer 110. In some embodiments, the second resist layer 112 is a photoresist layer including chemicals that are sensitive to light, such as UV light. In some embodiments, the second resist layer 112 can also be an electron-beam sensitive layer. In some embodiments, the second resist layer 112 is formed using a spin-on coating method. In some embodiments, the second resist layer 112 includes one or more organic polymer materials. In some embodiments, the second resist layer 112 has a thickness in a range from about 10 nm to about 100 nm. In some embodiments, the second resist layer 112 includes materials that are substantially similar to the materials of the first resist layer 106.

Referring to FIGS. 5A-5B, a lithography process is performed to the second resist layer 112 to form a first cut pattern 204. In some embodiments, the first cut pattern 204 includes a trench 204 to be formed in the second resist layer 112. In some embodiments, the first cut pattern 204 is formed using a lithography process. In some embodiments, the lithography process includes exposing the second resist layer 112 to a light source using a mask, performing post-exposure bake processes, and developing the second resist layer 112 to form the first cut pattern 204 (e.g., the first trench 204) in the second resist layer 112 as shown in FIGS. 5A-5B.

Referring to FIGS. 6A-6B, the patterned second resist layer 112 is used as an etching mask to transfer the first cut pattern 204 to the hard mask layer 110. In some embodiments, the regions that are not covered by the patterned second resist layer 112 (e.g., regions corresponding to the first cut pattern 204) are removed using one or more etching processes to form the first cut pattern (e.g., the first trench 204) in the hard mask layer 110 as shown in FIG. 6B. In some embodiments, the one or more etching processes include a selective dry etch process, such as a plasma etching process, a selective wet etching process, or a combination thereof. During the etching processes, the corresponding portions of the hard mask layer 110 are selectively etched, while the middle layer 108 remains unetched. In some embodiments when the hard mask layer 110 includes silicon oxide, silicon nitride, and/or silicon oxynitride (SiON), the etching process includes using an etching gas including at least one of carbon tetrafluoride ($CF_4$), difluoromethane ($CH_2F_2$), trifluoromethane ($CHF_3$), other suitable etching gases, or combinations thereof. In some embodiments when the hard mask layer 110 includes titanium nitride, the etching process includes using an etching gas including at least chlorine ($Cl_2$) or any other suitable etching gases.

Figure 7B:
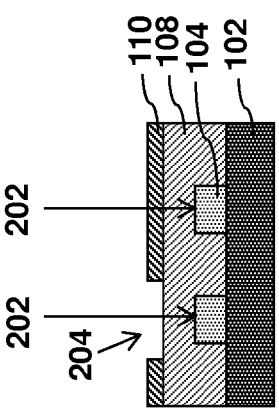

Referring to FIGS. 7A-7B, after transferring the first cut pattern 204 to the hard mask layer 110, the second resist layer 112 is removed. In some embodiments, the second resist layer 112 is removed by a wet stripping process, a plasma ashing process, and/or other suitable methods. In some embodiments, the plasma ashing process includes using gases including at least one of oxygen ($O_2$), carbon dioxide ($CO_2$), nitrogen ($N_2$), hydrogen ($H_2$), or combinations thereof.

Figure 8A:
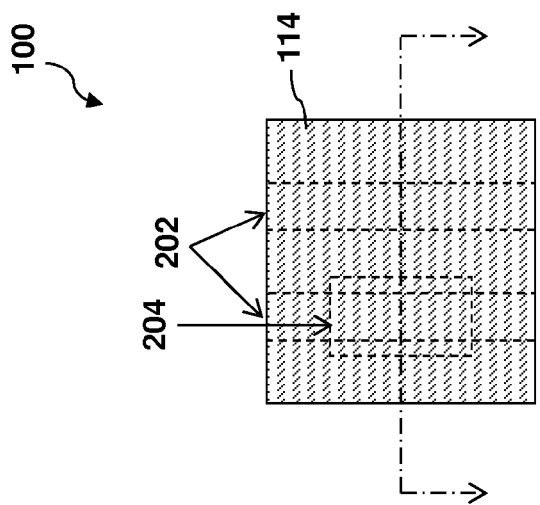
Figure 8B:
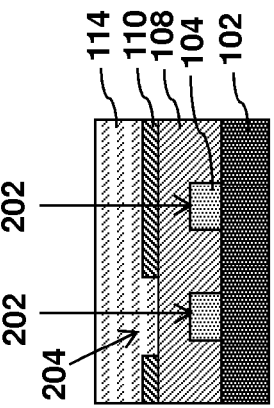

Referring to FIGS. 8A-8B, a third resist layer 114 is formed to cover the patterned hard mask layer 110. In some embodiments, the third resist layer 114 is a photoresist layer including chemicals that are sensitive to light, such as UV light. In some embodiments, the third resist layer 114 can also be an electron-beam sensitive layer. In some embodiments, the third resist layer 114 is formed using a spin-on coating method. In some embodiments, the third resist layer 114 includes one or more organic polymer materials. In some embodiments, the third resist layer 114 has a thickness in a range from about 10 nm to about 100 nm. In some embodiments, the third resist layer 114 is substantially similar to the first resist layer 106.

Figure 9A:
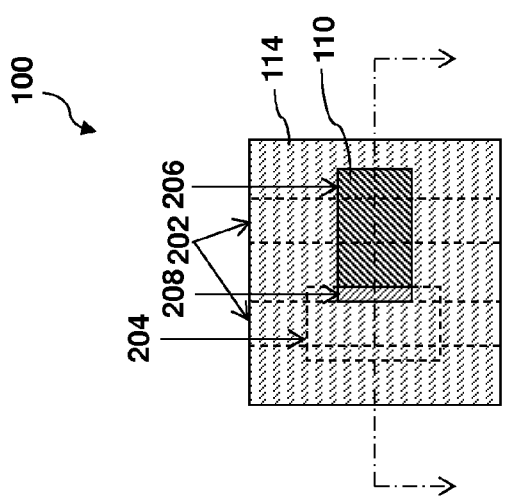
Figure 9B:
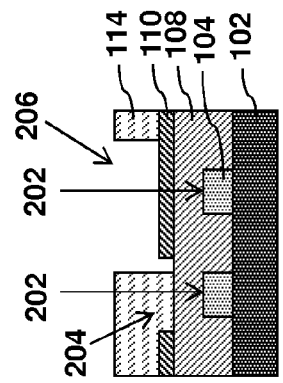

Referring to FIGS. 9A-9B, a lithography process is performed to the third resist layer 114 to form a second cut pattern 206. In some embodiments, the second cut pattern 206 includes a second trench 206 to be formed in the third resist layer 114. In some embodiments, the second cut pattern 206 is formed using a lithography process. In some embodiments, the lithography process includes exposing the third resist layer 114 to a light source using a mask, performing post-exposure bake processes, and developing the third resist layer 114 to form the second cut pattern 206 (e.g., the second trench 206) in the third resist layer 114 as shown in FIGS. 9A-9B.

Figure 10A:
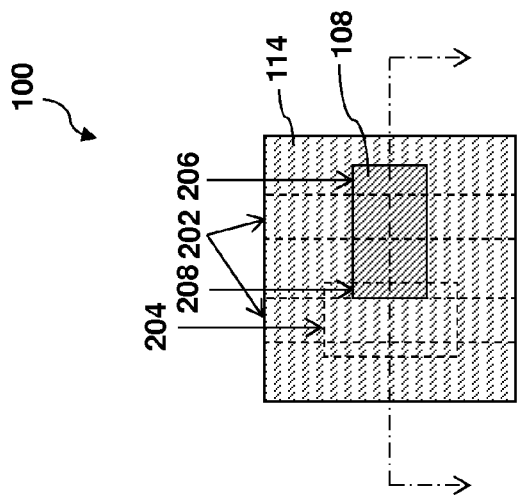
Figure 10B:
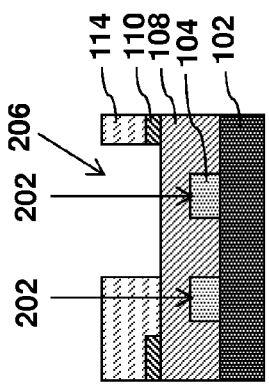

Referring to FIGS. 10A-10B, the patterned third resist layer 114 is used as an etching mask to transfer the second cut pattern 206 to the hard mask layer 110. In some embodiments, the regions that are not covered by the patterned third resist layer 114 (e.g., regions corresponding to the second cut pattern 206) are removed using one or more etching processes to form the second cut pattern (e.g., the second trench 206) in the hard mask layer 110 as shown in FIG. 10B. In some embodiments, the one or more etching processes include a selective dry etch process, such as a plasma etching process, a selective wet etching process, or a combination thereof. During the etching processes, the corresponding portions of the hard mask layer 110 are selectively etched, while the middle layer 108 remains unetched. In some embodiments when the hard mask layer 110 includes silicon oxide, silicon nitride, and/or silicon oxynitride (SiON), the etching process includes using an etching gas including at least one of carbon tetrafluoride ($CF_4$), difluoromethane ($CH_2F_2$), trifluoromethane ($CHF_3$), other suitable etching gases, or combinations thereof. In some embodiments when the hard mask layer 110 includes titanium nitride, the etching process includes using an etching gas including at least chlorine ($Cl_2$) or any other suitable etching gases. In some embodiments, the etching processes are substantially similar to the etching processes used to form the first cut pattern 204 in the hard mask layer 110 with reference to FIGS. 6A-6B.

In some embodiments, the first cut pattern 202 and the second cut pattern 206 includes an overlapping region 208 as shown in FIGS. 9A and 10A. By using more than one lithography process as discussed in the present disclosure, the first cut pattern 202 and the second cut pattern 206 can jointly form a combined cut pattern 210. The combined cut pattern 210 includes a complex shape that cannot be formed using a single lithography process. The combined cut pattern 210 is used to form a complex shape in the main pattern as discussed later.

Referring to FIGS. 11A-11B, the third resist layer 114 is removed. In some embodiments, the third resist layer 114 is removed by a wet stripping process, a plasma ashing process, and/or other suitable methods. In some embodiments, the plasma ashing process includes using gases including at least one of oxygen ($O_2$), carbon dioxide ($CO_2$), nitrogen ($N_2$), hydrogen ($H_2$), or combinations thereof. As shown in FIG. 11A, after removing the third resist layer 114, the patterned hard mask layer 110 including the combined cut pattern 210 of the first cut pattern 204 and the second cut pattern 206 is exposed.

Referring to FIGS. 12A-12B, the patterned hard mask layer 110 is used as an etching mask to transfer the combined cut pattern 210 to the middle layer 108. In some embodiments, the regions that are not covered by the patterned hard mask layer 110 (e.g., regions corresponding to the combined cut pattern 210) are removed using one or more etching processes. In some embodiments, the one or more etching processes include a selective dry etch process, such as a plasma etching process, a selective wet etching process, or a combination thereof. During the etching processes, the corresponding portions of the middle layer 108 are selectively etched, while the patterning-target layer 104 remains unetched. In some embodiments, the etching process includes using an etching gas including carbon tetrafluoride ($CF_4$) and/or other suitable etching gases. After etching the middle layer 108, one or more intersection portions 212 between the main pattern 202 and the combined cut pattern 210 are exposed as shown in FIG. 12A. The one or more intersection portions 212 are formed to cut some portions from the main pattern 202 in the patterning-target layer 104 in the following processes.

Referring to FIGS. 13A-13B, the etched middle layer 108 and the etched hard mask layer 110 are used as etching masks to form a final pattern to the patterning-target layer 104. In some embodiments, the final pattern includes the main pattern 202 subtracting the overlapping portion 212. In some embodiments, the regions of the main pattern 202 in the patterning-target layer 104 exposed by the combined cut pattern 210 (e.g., the intersection portions 212) are removed using one or more etching processes. In some embodiments, the one or more etching processes include a selective dry etch process, such as a plasma etching process, a selective wet etching process, or a combination thereof, so that the corresponding portions of the patterning-target layer 104 can be selectively etched. In some embodiments, the etching process includes using etching gases including at least one of carbon tetrafluoride ($CF_4$), difluoromethane ($CH_2F_2$), trifluoromethane ($CHF_3$), other suitable etching gases, or combinations thereof.

Referring to FIGS. 14A-14B, the hard mask layer 110 is removed. In some embodiments, the hard mask layer 110 is removed using a chemical mechanical polish (CMP) method. In some embodiments, the hard mask layer 110 is removed using one or more etching processes. The etching processes may include a selective dry etch process, such as a plasma etching process, a selective wet etching process, or a combination thereof. During the etching processes, the hard mask layer 110 can be selectively etched, while the middle layer 108 and the patterning-target layer 104 remain unetched. In some embodiments when the hard mask layer 110 includes silicon oxide, silicon nitride, and/or silicon oxynitride (SiON), the etching process includes using an etching gas including at least one of carbon tetrafluoride ($CF_4$), difluoromethane ($CH_2F_2$), trifluoromethane ($CHF_3$), other suitable etching gases, or combinations thereof. In some embodiments when the hard mask layer 110 includes titanium nitride, the etching process includes using an etching gas including at least chlorine ($Cl_2$) or any other suitable etching gases.

Referring to FIGS. 15A-15C, the middle layer 108 is removed. In some embodiments, the middle layer 108 is removed using a chemical mechanical polish (CMP) method. In some embodiments, the middle layer 108 is removed using one or more etching processes. The one or more etching processes may include a selective dry etch process, such as a plasma etching process, a selective wet etching process, or a combination thereof. During the etching processes, the middle layer 108 is selectively etched, while the patterning-target layer 104 remains unetched. In some embodiments, the etching process includes using an etching gas including carbon tetrafluoride ($CF_4$) and/or other suitable etching gases. After etching the middle layer 108, the final pattern including the main pattern 202 subtracting the intersection portions 212 is shown in FIG. 15A.

As shown in FIGS. 15A-15C, the final pattern (F) in the patterning-target layer 104 includes one or more main pattern (M) (e.g., lines 202) subtracting the intersection portions 212 (e.g., trenches 212). In some embodiments as discussed earlier in the present disclosure, the overlapping portion 212 corresponds to the intersection (∩) between the main pattern (M) and the combined cut pattern 210. The combined cut pattern is the union (∪) of the first cut pattern 204 (P1) and the second cut pattern 206 (P2). Therefore, the formation of the final pattern (F) can be illustrated using Equation 1:

$$F=M-(M\cap(P1\cup P2)) \tag{1}$$

In some embodiments, by using multiple lithography processes as discussed in the present disclosure, the semiconductor structure 150 may include a final pattern in the patterning-target layer 104 with complex shapes as shown in FIGS. 16A-16C, which cannot be formed using a single lithography process. As shown in FIGS. 16A-16C, the combined cut pattern 210 formed as the union of the first cut pattern and the second cut pattern may include union of more than one elliptical shape having curved lines. The intersection portions 212 includes polygons with straight lines and curved lines as shown in FIG. 16A. The final pattern may one or more trenches with straight and/or curved edges cut from the main pattern (e.g., lines) as shown in FIG. 16C.

Figure 17:
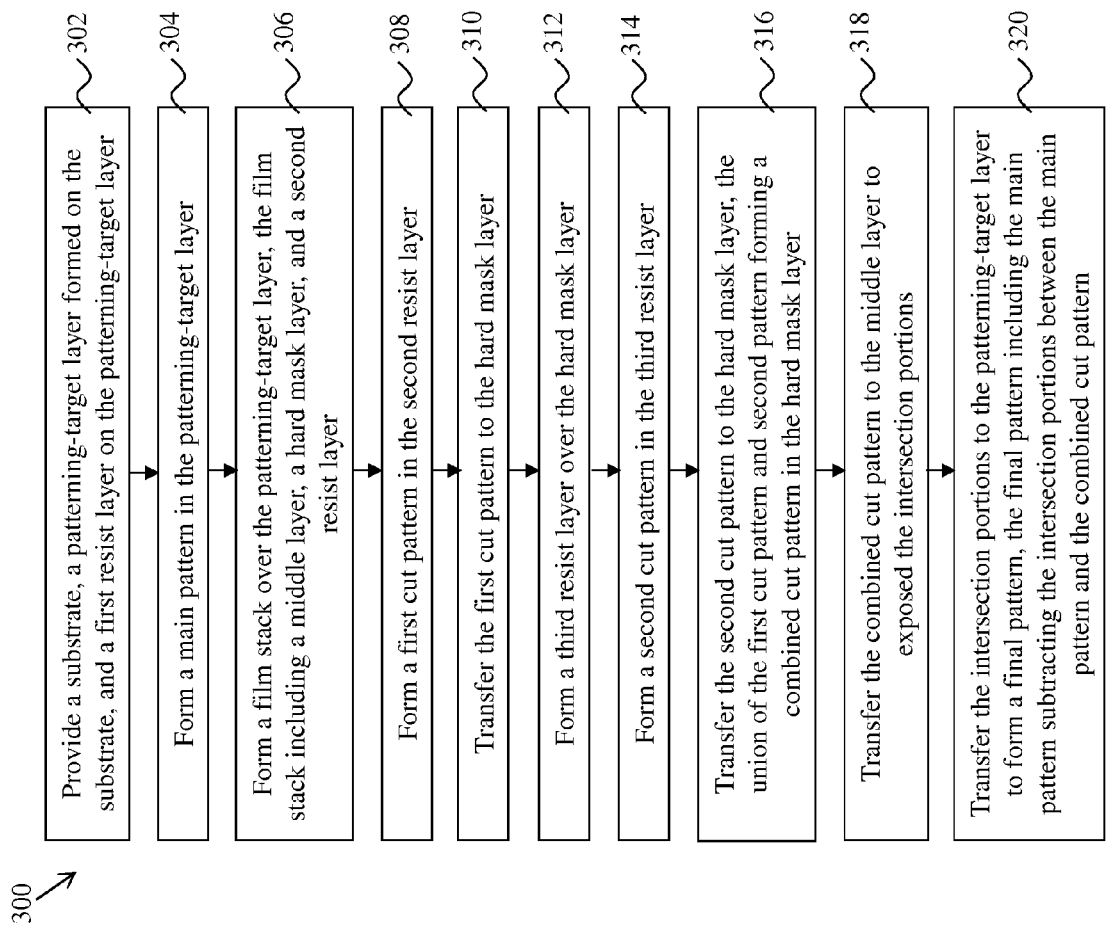
FIG. 17 is a flowchart showing a method of forming patterns using multiple lithography processes in the semiconductor structure, in accordance with some embodiments.

FIG. 17 illustrates a method 300 of forming patterns using multiple lithography processes in the semiconductor structure 100 as discussed with reference to FIGS. 1A-1B to 15A-15C. Method 300 starts from operation 302 by providing the substrate 102 and the patterning-target layer 104 formed over the substrate 102. In some embodiments, the patterning-target layer 104 is formed by one or more processes selected from the group consisting of CVD, PVD, ALD, spin-on method, sputtering, thermal oxidation, and a combination thereof. In some embodiments, the first resist layer 106 is also formed over the patterning-target layer 104 using a spin-on coating method.

Method 300 proceeds to operation 304 by forming a main pattern 202 in the patterning-target layer 104. In some embodiments, the main pattern 202 includes one or more lines. In some embodiments, the main pattern 202 is first formed in the first resist layer 106 using a lithography process. In some embodiments, the lithography process includes exposing the first resist layer 106 to a light source, performing post-exposure bake processes, and developing the first resist layer 106. The main pattern 202 is then transferred to the patterning-target layer 104 by one or more etching processes using the patterned first resist layer 106 as an etching mask. In some embodiments, the first resist layer 106 is then removed by a wet stripping process, a plasma ashing process, and/or other suitable methods.

Method 300 proceeds to operation 306 by forming the film stack 107 over the patterning-target layer. In some embodiments, the film stack 107 includes the middle layer 108 formed over the patterning-target layer 104 and the substrate 102, the hard mask layer 110 formed over the middle layer 108, and the second resist layer 112 formed over the hard mask layer 110. In some embodiments, the hard mask layer 110 is formed by one or more processes selected from the group consisting of CVD, PVD, ALD, spin-on method, sputtering, thermal oxidation, and a combination thereof. In some embodiments, the middle layer 108 and the second resist layer 112 are formed using spin-on coating methods.

Method 300 proceeds to operation 308 by forming a first cut pattern 204 in the second resist layer 112. In some embodiments, the first cut pattern 204 includes one or more trenches 204 as shown in FIGS. 5A-5B. In some embodiments, the first cut pattern 204 is formed using a lithography process. In some embodiments, the lithography process includes exposing the second resist layer 112 to a light source, performing post-exposure bake processes, and developing the second resist layer 112 to remove the regions corresponding to the first cut pattern 204 (e.g., the first trench 204) in the second resist layer 112 as shown in FIGS. 5A-5B.

Method 300 proceeds to operation 310 by transferring the first cut pattern 204 to the hard mask layer 110. In some embodiments, the hard mask layer 110 is etched using the patterned second resist layer 112 as an etching mask. In some embodiments, the etching processes include a selective dry etch process, such as a plasma etching process, a selective wet etching process, or a combination thereof. During the etching processes, the portions corresponding to the first cut pattern 204 (e.g., the first trench 204) can be selectively removed from the hard mask layer 110, while the middle layer 108 remains unetched. In some embodiments, the second resist layer 112 is then removed by a wet stripping process, a plasma ashing process, and/or other suitable methods.

Method 300 proceeds to operation 312 by forming a third resist layer 114 on the hard mask layer 110 as shown in FIGS. 8A-8B. In some embodiments, the third resist layer 114 is formed using a spin-on coating method.

Method 300 proceeds to operation 314 by forming a second cut pattern 206 in the third resist layer 114. In some embodiments, the second cut pattern 206 includes one or more trenches 206 as shown in FIGS. 9A-9B. In some embodiments, the second cut pattern 206 is formed using a lithography process. In some embodiments, the lithography process includes exposing the third resist layer 114 to a light source, performing post-exposure bake processes, and developing the third resist layer 114 to remove the regions corresponding to the second cut pattern 206 (e.g., the second trench 206) in the third resist layer 114 as shown in FIGS. 9A-9B.

Method 300 proceeds to operation 316 by transferring the second cut pattern 206 to the hard mask layer 110. In some embodiments, the hard mask layer 110 is etched using the patterned third resist layer 114 as an etching mask. In some embodiments, the etching processes include a selective dry etch process, such as a plasma etching process, a selective wet etching process, or a combination thereof. During the etching processes, the portions corresponding to the second cut pattern 206 (e.g., the second trench 206) can be selectively removed from the hard mask layer 110, while the middle layer 108 remains unetched. In some embodiments, the third resist layer 114 is then removed by a wet stripping process, a plasma ashing process, and/or other suitable methods. In some embodiments after removing the third resist layer 114, the union of the first cut pattern 204 and the second cut pattern form the combined cut pattern 210 as shown in the hard mask layer 110 in FIG. 11A.

Method 300 proceeds to operation 318 by transferring the combined cut pattern 210 to the middle layer 108. In some embodiments, the patterned hard mask layer 110 is used as an etching mask to transfer the combined cut pattern 210 to the middle layer 108. In some embodiments, the regions that are not covered by the patterned hard mask layer 110 (e.g., the regions corresponding to the combined cut pattern 210) are removed using one or more etching processes. After etching the middle layer 108, one or more intersection portions 212 between the main pattern 202 and the combined cut pattern 210 are exposed as shown in FIG. 12A. The one or more intersection portions 212 are formed to cut some portions from the main pattern 202 in the patterning-target layer 104 in the following processes.

Method 300 proceeds to operation 320 by transferring the intersection portions 212 to the main pattern 202 in the patterning-target layer 104 as shown in FIGS. 13A-13B. The final pattern includes the main pattern in the patterning-target layer 104 subtracting the intersection portions between the main pattern 202 and the combined cut pattern 210. In some embodiments, the patterned middle layer 108 and the patterned hard mask layer 110 used as etching masks to etch the main pattern in the patterning-target layer 104 using one or more etching processes. During the etching processes, the corresponding portions of the patterning-target layer 104 can be selectively etched to form the final pattern in the patterning-target layer 104.

In some embodiments, the hard mask layer 110 is then removed using a CMP process, or one or more suitable selective etching processes. The etching processes may include a dry etch process, such as a plasma etching process, a wet etching process, or a combination thereof. During the etching processes, the corresponding portions of the hard mask layer 110 can be selectively etched, while the middle layer 108 and the patterning-target layer 104 remain unetched. In some embodiments, the middle layer 108 is also removed using a chemical mechanical polish (CMP) method. In some embodiments, the middle layer 108 is removed using one or more etching processes. The one or more etching processes may include a selective dry etch process, such as a plasma etching process, a selective wet etching process, or a combination thereof. During the etching processes, the middle layer 108 is selectively etched, while the patterning-target layer 104 remains unetched.

Figure 18A:
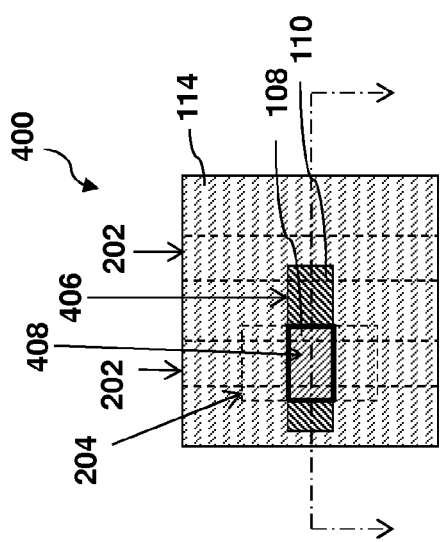
Figure 18B:
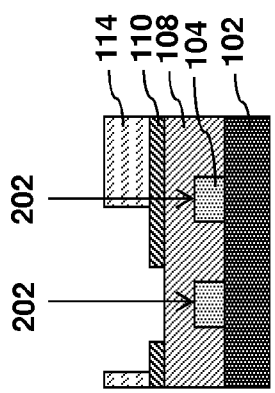

FIGS. 18A-18B to FIGS. 23A-23C and FIG. 24 illustrate some embodiments of the mechanisms of forming patterns in a semiconductor structure 400. Prior to forming the semiconductor structure 400 as shown in FIGS. 18A-18B, the semiconductor structure 400 includes the substrate 102, the main pattern 202 (e.g., lines 202) formed in the patterning-target layer 104, the middle layer 108, the first cut pattern 204 (e.g., the first trench 204) formed in the hard mask layer 110, and the third resist layer 114 formed over the hard mask layer 110, all of which are substantially similar to those as discussed with respect to FIGS. 1A-1B to FIGS. 8A-8B. In some embodiments, the substrate 102, the patterning-target layer 104, the middle layer 108, the hard mask layer 110, and the third resist layer 114, the main pattern 202, and the first cut pattern 204 are formed in the semiconductor structure 400 using substantially similar fabrication operations as discussed with regard to operations 302-312 of method 300 in FIG. 17.

Referring to FIGS. 18A-18B, a second cut pattern 406 is formed in the third resist layer 114 using a lithography process. In some embodiments, the second cut pattern 406 includes a second trench 406 to be formed in the third resist layer 114. In some embodiments, the second cut pattern 406 is perpendicular to the first cut pattern 204, and forms a first intersection portion 408 with the first cut pattern 204 as shown in FIG. 18A. In some embodiments, the lithography process includes exposing the third resist layer 114 to a light source using a mask, performing post-exposure bake processes, and developing the third resist layer 114 to form the second cut pattern 406 (e.g., the second trench 406) in the third resist layer 114 as shown in FIGS. 18A-18B. After developing the third resist layer 114, the first intersection portion 408 in the middle layer 108 is exposed as enclosed by the edges of the patterned hard mask layer 110 in FIG. 18A.

Figure 19A:
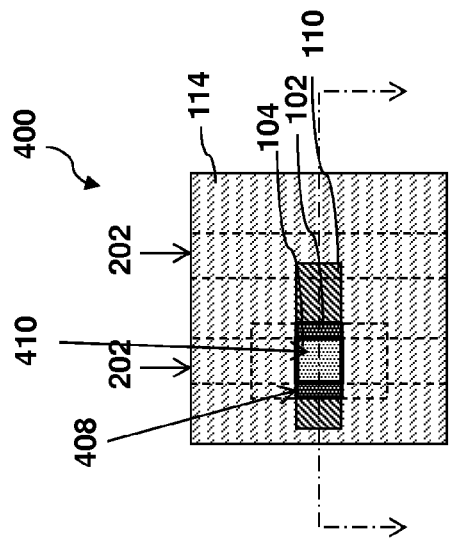
Figure 19B:
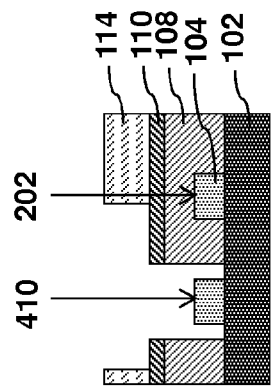

Referring to FIGS. 19A-19B, the patterned third resist layer 114 and the patterned hard mask layer 110 are used together as etching masks to remove the exposed first intersection portion 408 in the middle layer 108. In some embodiments, the first intersection portion 408 in the middle layer 108 is removed using one or more etching processes. In some embodiments, the one or more etching processes include a selective dry etch process, such as a plasma etching process, a selective wet etching process, or a combination thereof. During the etching processes, the corresponding portions of the middle layer 108 are selectively etched, while the patterning-target layer 104 remains unetched. In some embodiments, the etching process includes using an etching gas including carbon tetrafluoride ($CF_4$) and/or other suitable etching gases. After removing the first intersection portion 408 of the middle layer 108, a second intersection portion 410 between the main pattern 202 and the first intersection portion 408 is exposed in the patterning-target layer 104 as shown in FIGS. 19A-19B.

Referring to FIGS. 20A-20B, the patterned third resist layer 114, the patterned hard mask layer 110, and the etched middle layer 108 are used as etching masks to remove the exposed second intersection portion 410 in the patterning-target layer 104 using one or more etching processes. In some embodiments, the one or more etching processes include a selective dry etch process, such as a plasma etching process, a selective wet etching process, or a combination thereof, so that the corresponding portions of the patterning-target layer 104 can be selectively etched. In some embodiments, the etching process includes using etching gases including at least one of carbon tetrafluoride ($CF_4$), difluoromethane ($CH_2F_2$), trifluoromethane ($CHF_3$), other suitable etching gases, or combinations thereof. After removing the second intersection portion 410 in the patterning-target layer 104, a portion corresponding to the first intersection portion 408 of the substrate 102 is exposed through the opening, and a portion corresponding to the second cut pattern 406 is exposed in the hard mask layer 110 as shown in FIG. 20A.

Referring to FIGS. 21A-21B, the third resist layer 114 is removed. In some embodiments, the third resist layer 114 is removed by a wet stripping process, a plasma ashing process, and/or other suitable methods. In some embodiments, the plasma ashing process includes using gases including at least one of oxygen ($O_2$), carbon dioxide ($CO_2$), nitrogen ($N_2$), hydrogen ($H_2$), or combinations thereof. As shown in FIGS. 21A-21B, after removing the third resist layer 114, the hard mask layer 110 including the first cut pattern 204 (e.g., the first trench 204) is exposed. The portion corresponding to the first intersection portion 408 in the substrate 102 is also exposed through the opening as shown in FIGS. 21A-21B.

Referring to FIGS. 22A-22B, the hard mask layer 110 is removed. In some embodiments, the hard mask layer 110 is removed using a chemical mechanical polish (CMP) method. In some embodiments, the hard mask layer 110 is removed using one or more etching processes. The etching processes may include a selective dry etch process, such as a plasma etching process, a selective wet etching process, or a combination thereof. During the etching processes, the hard mask layer 110 can be selectively etched, while the middle layer 108 and the patterning-target layer 104 remain unetched. In some embodiments when the hard mask layer 110 includes silicon oxide, silicon nitride, and/or silicon oxynitride (SiON), the etching process includes using an etching gas including at least one of carbon tetrafluoride ($CF_4$), difluoromethane ($CH_2F_2$), trifluoromethane ($CHF_3$), other suitable etching gases, or combinations thereof. In some embodiments when the hard mask layer 110 includes titanium nitride, the etching process includes using an etching gas including at least chlorine ($Cl_2$) or any other suitable etching gases.

Referring to FIGS. 23A-23C, the middle layer 108 is removed. In some embodiments, the middle layer 108 is removed using a chemical mechanical polish (CMP) method. In some embodiments, the middle layer 108 is removed using one or more etching processes. The one or more etching processes may include a selective dry etch process, such as a plasma etching process, a selective wet etching process, or a combination thereof. During the etching processes, the middle layer 108 is selectively etched, while the patterning-target layer 104 remains unetched. In some embodiments, the etching process includes using an etching gas including carbon tetrafluoride ($CF_4$) and/or other suitable etching gases. After etching the middle layer 108, the final pattern including the main pattern 202 subtracting the second intersection portions 410 is exposed on the substrate 102 as shown in FIG. 23A.

As shown in FIGS. 23A-23C, the final pattern (F) in the patterning-target layer 104 includes one or more main pattern (M) (e.g., lines 202) subtracting the second intersection portion 410. In some embodiments as discussed earlier in the present disclosure, the second intersection portion 410 corresponds to the intersection (∩) between the main pattern (M) and the first intersection portion 408. The first intersection portion 408 corresponds to the intersection (∩) between the first cut pattern 204 (P1) and the second cut pattern 206 (P2). Therefore, the formation of the final pattern (F) can be illustrated using Equation 2:

$$F = M - (M \cap (P1 \cap P2)) \tag{2}$$

In some embodiments, by using multiple lithography processes as discussed in the present disclosure, the final pattern may include dense feature(s) that are disposed from an adjacent feature for less than about a minimum pitch value. In some embodiments, the final pattern may include complex shapes and/or large-size shapes which cannot be formed using a single lithography process. In some embodiments, the final pattern has sharp and clear edges and is free of "rounding issues".

Figure 24:
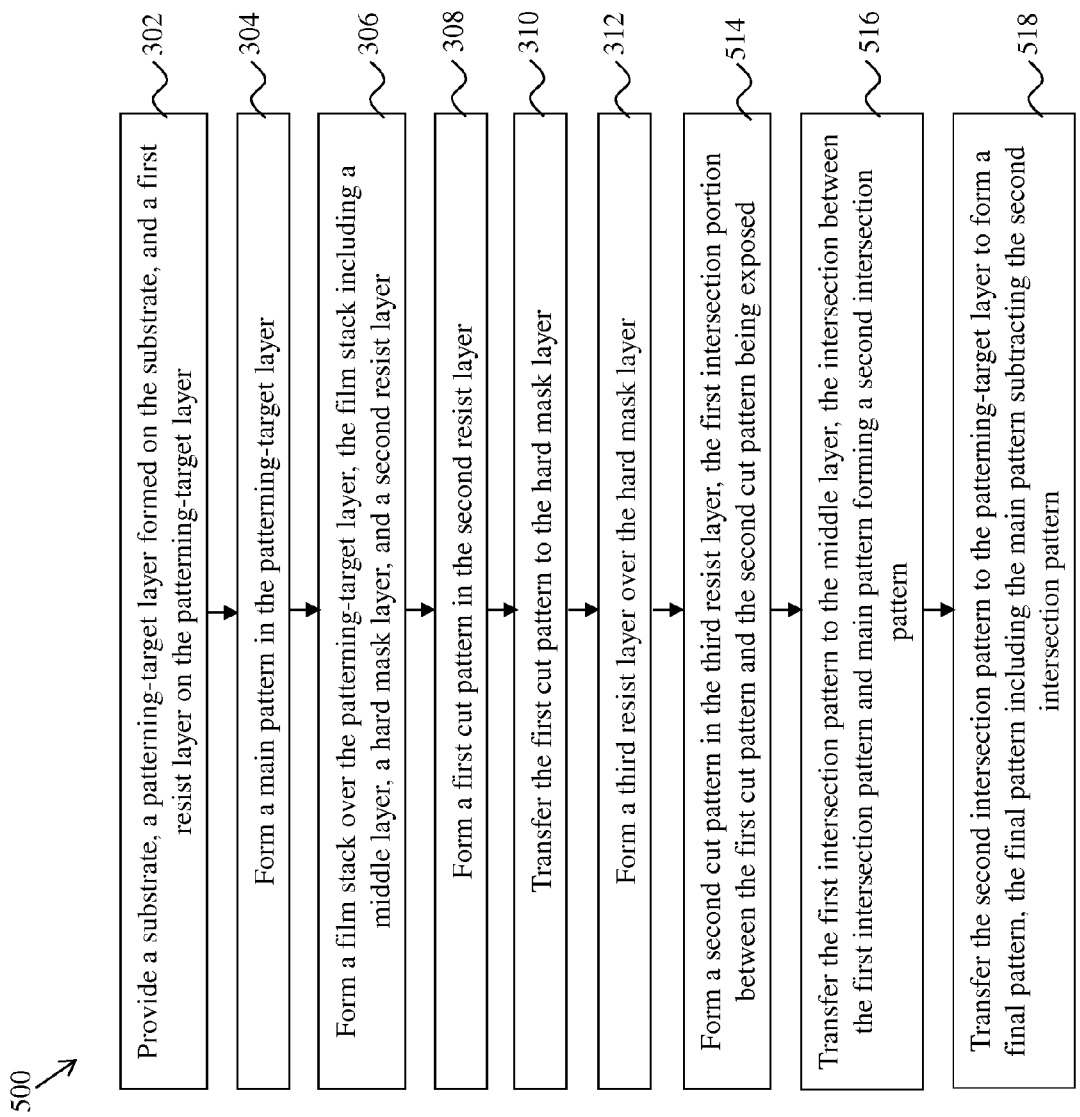
FIG. 24 is a flowchart showing a method of forming patterns using multiple lithography processes in the semiconductor structure, in accordance with some embodiments.

FIG. 24 illustrates a method 500 of forming patterns using multiple lithography processes in the semiconductor structure 400 as discussed with reference to FIGS. 1A-1B, 2A-2B, 3A-3B, 4A-4B, 5A-5B, 6A-6B, 7A-7B, 8A-8B, 18A-18B, 19A-19B, 20A-20B, 21A-21B, 22A-22B, and 23A-23C. The operations 302, 304, 306, 308, 310, and 312 of method 500 are substantially similar to the operations 302, 304, 306, 308, 310, and 312 of method 300 as discussed earlier in the present disclosure.

After forming the third resist layer 114 on the hard mask layer 110 as shown in FIGS. 8A-8B, method 500 proceeds to operation 514 by forming a second cut pattern 406 in the third resist layer 114. In some embodiments, the second cut pattern 406 is perpendicular to the first cut pattern 204, and forms a first intersection portion 408 with the first cut pattern 204 as shown in FIG. 18A. In some embodiments, the second cut pattern 406 is formed using a lithography process. In some embodiments, the lithography process includes exposing the third resist layer 114 to a light source, performing post-exposure bake processes, and developing the third resist layer 114 to remove the regions corresponding to the second cut pattern 406 (e.g., the second trench 406) in the third resist layer 114 as shown in FIGS. 18A-18B. In some embodiments, after forming a second cut pattern 406 in the third resist layer 114, the first intersection portion 408 in the middle layer 108 is exposed as enclosed by the edges of the patterned hard mask layer 110 in FIG. 18A.

Method 500 proceeds to operation 516 by transferring the first intersection portion 408 to the middle layer 108 using the patterned third resist layer 114 and the etched hard mask layer 110 as etching masks. In some embodiments, the one or more etching processes include a selective dry etch process, such as a plasma etching process, a selective wet etching process, or a combination thereof. During the etching processes, the corresponding portions of the middle layer 108 are selectively etched, while the patterning-target layer 104 remains unetched. After removing the first intersection portion 408 in the middle layer 108, a second intersection portion 410 between the main pattern 202 and the first intersection portion 408 is exposed in the patterning-target layer 104 as shown in FIGS. 19A-19B.

Method 500 proceeds to operation 518 by transferring the second intersection portion 410 to the patterning-target layer 104 using the patterned third resist layer 114, the patterned hard mask layer 110, and the etched middle layer 108 are used as etching masks in one or more etching processes. In some embodiments, the one or more etching processes include a selective dry etch process, so that the corresponding portions of the patterning-target layer 104 can be selectively etched. The final pattern includes the main pattern 202 subtracting the second intersection portion 410 between the main pattern 202 and the first intersection portion 408 between the first cut pattern 204 and the second cut pattern 406. In some embodiments, the third resist layer 114 is then removed by a wet stripping process, a plasma ashing process, and/or other suitable methods.

In some embodiments, the hard mask layer 110 is then removed using a CMP process, or one or more suitable selective etching processes. The etching processes may include a dry etch process, such as a plasma etching process, a wet etching process, or a combination thereof. During the etching processes, the corresponding portions of the hard mask layer 110 can be selectively etched, while the middle layer 108 and the patterning-target layer 104 remain unetched. In some embodiments, the middle layer 108 is also removed using a chemical mechanical polish (CMP) method. In some embodiments, the middle layer 108 is removed using one or more etching processes. The one or more etching processes may include a selective dry etch process, such as a plasma etching process, a selective wet etching process, or a combination thereof. During the etching processes, the middle layer 108 is selectively etched, while the patterning-target layer 104 remains unetched.

FIGS. 25A-25B to FIGS. 33A-33B and FIG. 35 illustrate some embodiments of the mechanisms of forming patterns in a semiconductor structure 600. Prior to forming the semiconductor structure 600 as shown in FIGS. 25A-25B, the semiconductor structure 600 includes the substrate 102, the main pattern 202 (e.g., lines 202) formed in the patterning-target layer 104, the middle layer 108, the first cut pattern 204 (e.g., the first trench 204) formed in the hard mask layer 110, and the third resist layer 114 formed over the hard mask layer 110, all of which are substantially similar to those as discussed with respect to FIGS. 1A-1B to FIGS. 8A-8B. In some embodiments, the substrate 102, the patterning-target layer 104, the middle layer 108, the hard mask layer 110, and the third resist layer 114, the main pattern 202, and the first cut pattern 204 are formed in the semiconductor structure 600 using substantially similar fabrication operations as discussed with regard to operations 302-312 of method 300 in FIG. 17.

Referring to FIGS. 25A-25B, a second cut pattern 606 is formed in the third resist layer 114 using a lithography process. In some embodiments, the second cut pattern 606 includes a second trench 606 to be formed in the third resist layer 114. In some embodiments, the second cut pattern 606 is perpendicular to the first cut pattern 204, and forms a first intersection portion 608 with the first cut pattern 204 as shown in FIG. 25A. In some embodiments, the lithography process includes exposing the third resist layer 114 to a light source using a mask, performing post-exposure bake processes, and developing the third resist layer 114 to form the second cut pattern 606 (e.g., the second trench 606) in the third resist layer 114 as shown in FIGS. 25A-25B. After developing the third resist layer 114, the first intersection portion 608 in the middle layer 108 is exposed as enclosed by the edges of the patterned hard mask layer 110 as shown in FIG. 25A.

Referring to FIGS. 26A-26B, the patterned third resist layer 114 and the patterned hard mask layer 110 are used together as etching masks to remove the exposed first intersection portion 608 in the middle layer 108. In some embodiments, the first intersection portion 608 in the middle layer 108 is removed using one or more etching processes. In some embodiments, the one or more etching processes include a selective dry etch process, such as a plasma etching process, a selective wet etching process, or a combination thereof. During the etching processes, the corresponding portions of the middle layer 108 are selectively etched, while the patterning-target layer 104 remains unetched. In some embodiments, the etching process includes using an etching gas including carbon tetrafluoride ($CF_4$) and/or other suitable etching gases. After removing the first intersection portion 608 of the middle layer 108, a second intersection portion 610 between the main pattern 202 and the first intersection portion 608 is exposed in the patterning-target layer 104 as shown in FIGS. 26A-26B.

Referring to FIGS. 27A-27B, a fill layer 650 is formed to fill in the open areas of the semiconductor structure 600. In some embodiments as shown in FIGS. 27A-27B, the fill layer 650 is formed to fill in the exposed open areas in the patterning-target layer 104, the middle layer 108, the hard mask layer 110, and the third resist layer 114. In some embodiments, the fill layer 650 is formed to cover the third resist layer 114 and to provide a planar top surface for the semiconductor structure 600. In some embodiments, the fill layer 650 includes one or more materials such as the material of the middle layer 108. In some embodiments, the fill layer 650 has a thickness in a range from about 100 nm to about 1000 nm. In some embodiments, the fill layer 650 is formed using a suitable deposition method such as CVD, PVD, ALD, spin-on method, sputtering, thermal oxidation, or a combination thereof.

Referring to FIGS. 28A-28B, portions of the fill layer 650 and the third resist layer 114 that are disposed above the hard mask layer 110 are removed. In some embodiments, the portions of the fill layer 650 and the third resist layer 114 are removed using a chemical mechanical polish (CMP) method to expose the top surface of the hard mask layer 110. In addition, the third resist layer 114 disposed in the open areas (e.g., the areas of the first cut pattern 204 that are not filled by the fill layer 650) of the patterned hard mask layer 110 is also removed by a wet stripping process, a plasma ashing process, other suitable methods, and/or combinations thereof. In some embodiments, the plasma ashing process includes using gases including at least one of oxygen ($O_2$), carbon dioxide ($CO_2$), nitrogen ($N_2$), hydrogen ($H_2$), or combinations thereof. After the etching and the CMP process, as shown in FIGS. 28A-28B, a portion of the fill layer 650 disposed in the first intersection portion 608 and the portions of the middle layer 108 that are not covered by the fill layer 650 (e.g., the portions corresponding to the first cut pattern 204 subtracting the first intersection portion 608) are exposed.

Referring to FIGS. 29A-29B, the exposed portions of the middle layer 108 (e.g., the portions corresponding to the first cut pattern 204 subtracting the first intersection portion 608) are removed by using the patterned hard mask layer 110 and the fill layer 650 disposed in the first intersection portion 608 as etching masks in one or more etching processes. In some embodiments, the one or more etching processes may include a selective dry etch process, such as a plasma etching process, a selective wet etching process, or a combination thereof. During the etching processes, the exposed portions of the middle layer 108 are selectively etched, while the patterning-target layer 104 and the fill layer 650 remain unetched. In some embodiments, the etching process includes using an etching gas including carbon tetrafluoride ($CF_4$) and/or other suitable etching gases. After the etching processes, the portions of the main pattern 202 in the patterning-target layer 104 that are previously covered by the exposed portions of the middle layer 108 are exposed. In some embodiments, the exposed portions of the main pattern 202 in the patterning-target layer 104 include third intersection portions 612 between the main pattern 202 and the first cut pattern 204 subtracting the first intersection portion 608 as shown in FIG. 29A.

Referring to FIGS. 30A-30B, the exposed portions of the main pattern 202 in the patterning-target layer 104 (e.g., the intersection portions between the main pattern 202 and the first cut pattern 204 subtracting the first intersection portion 608) are removed by using the patterned hard mask layer 110 and the fill layer 650 disposed in the first intersection portion 608 as etching masks in one or more etching processes. In some embodiments, the one or more etching processes include a selective dry etch process, such as a plasma etching process, a selective wet etching process, or a combination thereof, so that the corresponding portions of the patterning-target layer 104 can be selectively etched. In some embodiments, the etching process includes using etching gases including at least one of carbon tetrafluoride ($CF_4$), difluoromethane ($CH_2F_2$), trifluoromethane ($CHF_3$), other suitable etching gases, or combinations thereof. After the etching processes, portions of the substrate 102 are exposed through the opening as shown in FIG. 30A.

Figure 31A:
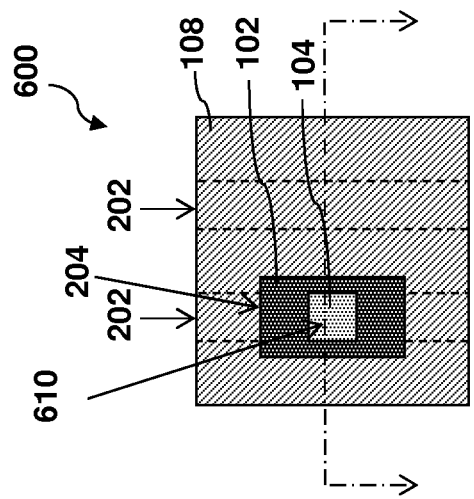
Figure 31B:
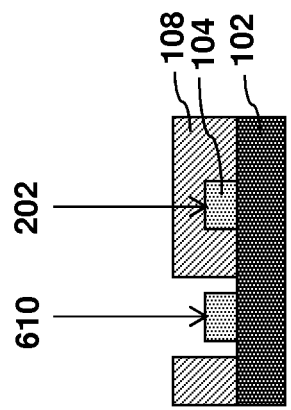

Referring to FIGS. 31A-31B, the fill layer 650 is removed to expose the second intersection portion 610 in the patterning-target layer 104. The second intersection portion 610 is an intersection portion between the main pattern 202 and the first intersection portion 608. In some embodiments, the fill layer 650 is removed using one or more selective etching processes. In some embodiments, the one or more etching processes include a selective dry etch process, such as a plasma etching process, a selective wet etching process, or a combination thereof, so that the fill layer 650 can be selectively removed, while the patterning-target layer 104 remains unetched. In some embodiments, the etching process includes using etching gases including at least one of carbon tetrafluoride ($CF_4$), difluoromethane ($CH_2F_2$), trifluoromethane ($CHF_3$), other suitable etching gases, or combinations thereof.

Figure 32A:
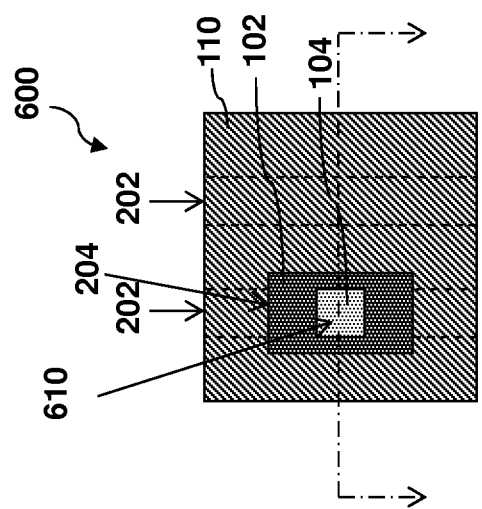
Figure 32B:
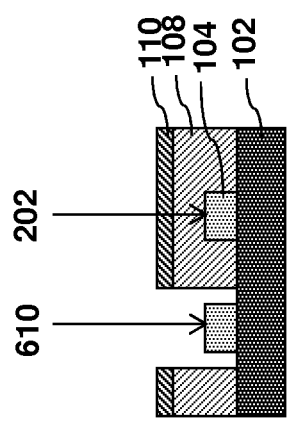

Referring to FIGS. 32A-32B, the hard mask layer 110 is removed. In some embodiments, the hard mask layer 110 is removed using a chemical mechanical polish (CMP) method. In some embodiments, the hard mask layer 110 is removed using one or more etching processes. The etching processes may include a selective dry etch process, such as a plasma etching process, a selective wet etching process, or a combination thereof. During the etching processes, the hard mask layer 110 can be selectively etched, while the middle layer 108 and the patterning-target layer 104 remain unetched. In some embodiments when the hard mask layer 110 includes silicon oxide, silicon nitride, and/or silicon oxynitride (SiON), the etching process includes using an etching gas including at least one of carbon tetrafluoride ($CF_4$), difluoromethane ($CH_2F_2$), trifluoromethane ($CHF_3$), other suitable etching gases, or combinations thereof. In some embodiments when the hard mask layer 110 includes titanium nitride, the etching process includes using an etching gas including at least chlorine ($Cl_2$) or any other suitable etching gases.

Figure 33A:
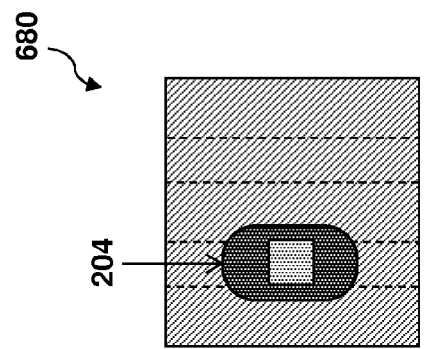
Figure 33B:
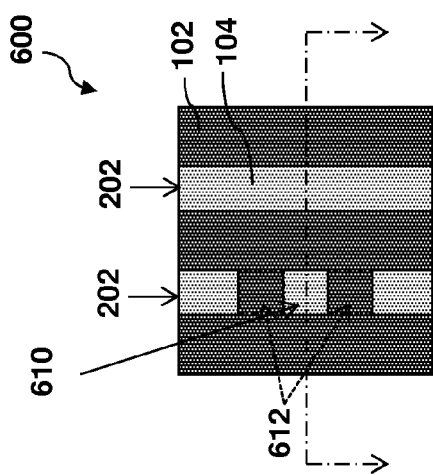

Referring to FIGS. 33A-33B, the middle layer 108 is removed. In some embodiments, the middle layer 108 is removed using a chemical mechanical polish (CMP) method. In some embodiments, the middle layer 108 is removed using one or more etching processes. The one or more etching processes may include a selective dry etch process, such as a plasma etching process, a selective wet etching process, or a combination thereof. During the etching processes, the middle layer 108 is selectively etched, while the patterning-target layer 104 remains unetched. In some embodiments, the etching process includes using an etching gas including carbon tetrafluoride ($CF_4$) and/or other suitable etching gases. After etching the middle layer 108, the final pattern including the main pattern 202 subtracting the third intersection portions 612 is exposed on the substrate 102 as shown in FIG. 33A.

As shown in FIGS. 33A-33B, the final pattern (F) in the patterning-target layer 104 includes one or more main pattern (M) (e.g., lines 202) subtracting the third intersection portions 612. In some embodiments as discussed earlier in the present disclosure, the third intersection portions 612 correspond to the intersection (∩) between the main pattern (M) and the first cut pattern 204 (P1) subtracting the first intersection portion 608. The first intersection portion 608 corresponds to the intersection (∩) between the first cut pattern 204 (P1) and the second cut pattern 206 (P2). Therefore, the formation of the final pattern (F) can be illustrated using Equation 3:

$$F = M - (M \cap (P1 - (P1 \cap P2))) \quad (3)$$
$$= M - ((M \cap P1) - (M \cap (P1 \cap P2)))$$

Figure 34A:
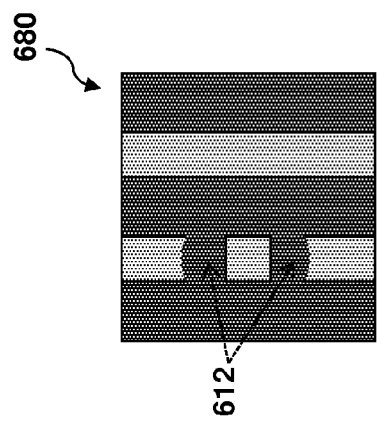
FIGS. 34A-34B are top views of the semiconductor structure including features with complex shapes at various fabrication stages constructed according to the method of FIG. 35, in accordance with some embodiments.
Figure 34B:
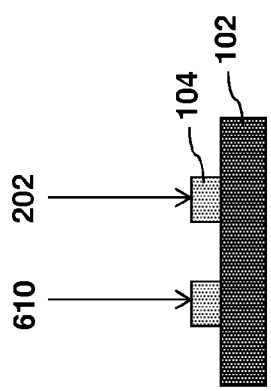

In some embodiments, by using multiple lithography processes as discussed in the present disclosure, the semiconductor structure 680 may include a final pattern in the patterning-target layer 104 with complex shapes as shown in FIGS. 34A-34B, which cannot be formed using a single lithography process. As shown in FIGS. 34A-34B, the first cut pattern 204 may include an elliptical shaped feature having curved lines. The third intersection portions 612 may include curved lines as shown in FIG. 34B. The final pattern may include one or more trenches with straight and/or curved edges cut from the main pattern (e.g., lines) as shown in FIG. 34B.

In some embodiments, by using multiple lithography processes as discussed in the present disclosure, the final pattern may include dense feature(s) that are disposed from an adjacent feature for less than about a minimum pitch value. In some embodiments, the final pattern may include complex shapes and/or large-size shapes which cannot be formed using a single lithography process.

Figure 35:
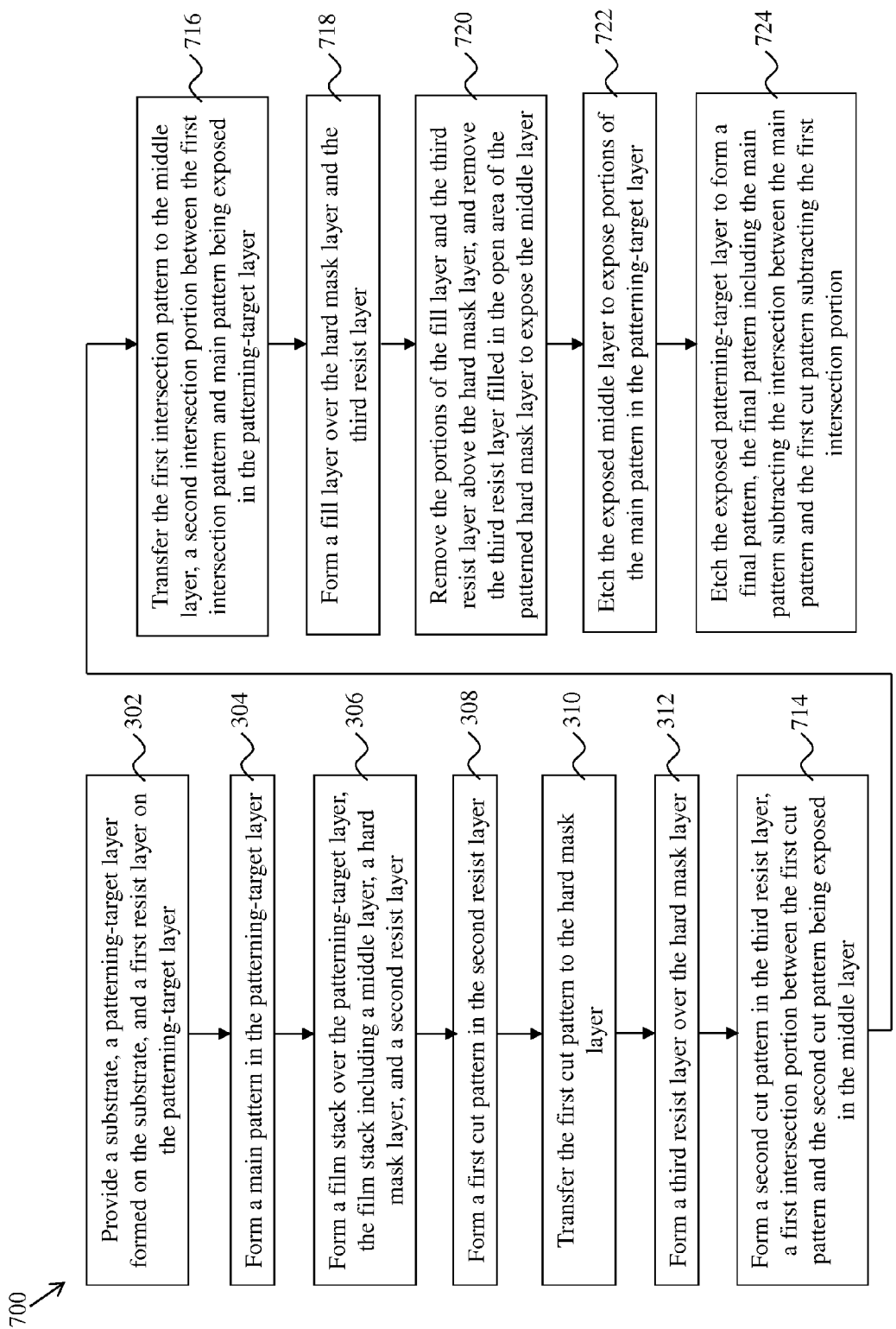
FIG. 35 is a flowchart showing a method of forming patterns using multiple lithography processes in the semiconductor structure, in accordance with some embodiments.

FIG. 35 illustrates a method 700 of forming patterns using multiple lithography processes in the semiconductor structure 600 as discussed with reference to FIGS. 1A-1B, 2A-2B, 3A-3B, 4A-4B, 5A-5B, 6A-6B, 7A-7B, 8A-8B, 25A-25B, 26A-26B, 27A-27B, 28A-28B, 29A-29B, 30A-30B, 31A-31B, 32A-32B, and 33A-33B. The operations 302, 304, 306, 308, 310, and 312 of method 700 are substantially similar to the operations 302, 304, 306, 308, 310, and 312 of method 300 as discussed earlier in the present disclosure.

After forming the third resist layer 114 on the hard mask layer 110 as shown in FIGS. 8A-8B, method 700 proceeds to operation 714 by forming a second cut pattern 606 in the third resist layer 114. In some embodiments, the second cut pattern 606 is perpendicular to the first cut pattern 204, and forms a first intersection portion 608 with the first cut pattern 204 as shown in FIG. 25A. In some embodiments, the second cut pattern 606 is formed using a lithography process. In some embodiments, the lithography process includes exposing the third resist layer 114 to a light source, performing post-exposure bake processes, and developing the third resist layer 114 to remove the regions corresponding to the second cut pattern 606 (e.g., the second trench 606) in the third resist layer 114 as shown in FIGS. 25A-25B. In some embodiments, after forming a second cut pattern 606 in the third resist layer 114, the first intersection portion 608 in the middle layer 108 is exposed as enclosed by the edges of the patterned hard mask layer 110 in FIG. 25A.

Method 700 proceeds to operation 716 by transferring the first intersection portion 608 to the middle layer 108 using the patterned third resist layer 114 and the etched hard mask layer 110 as etching masks. In some embodiments, the one or more etching processes include a selective dry etch process, such as a plasma etching process, a selective wet etching process, or a combination thereof. During the etching process, the corresponding portions of the middle layer 108 are selectively etched, while the patterning-target layer 104 remains unetched. After removing the first intersection portion 608 in the middle layer 108, a second intersection portion 610 between the main pattern 202 and the first intersection portion 608 is exposed in the patterning-target layer 104 as shown in FIGS. 26A-26B.

Method 700 proceeds to operation 718 by forming the fill layer 650 to fill in the open areas of the semiconductor structure 600, and to cover the third resist layer 114 providing a planar top surface for the semiconductor structure 600. In some embodiments, the fill layer 650 is formed using a suitable deposition method such as CVD, PVD, ALD, spin-on method, sputtering, thermal oxidation, and a combination thereof.

Method 700 proceeds to operation 720 by removing the portions of the fill layer 650 and the third resist layer 114 above the hard mask layer 110 using a CMP process. In addition, the third resist layer 114 disposed in the open area of the patterned hard mask layer 110 is also removed to expose portions of the middle layer 108. In some embodiments, the third resist layer 114 is removed by a wet stripping process, a plasma ashing process, other suitable methods, and/or combinations thereof.

Method 700 proceeds to operation 722 by etching the exposed portions of the middle layer 108 using the patterned hard mask layer 110 and the fill layer 650 disposed in the first intersection portion 608 as etching masks to exposed portions of the main pattern 202 in the patterning-target layer 104 as shown in FIG. 29A. In some embodiments, the one or more etching processes include a selective dry etch process, such as a plasma etching process, a selective wet etching process, or a combination thereof. During the etching processes, the corresponding portions of the middle layer 108 are selectively etched, while the patterning-target layer 104 and the fill layer 650 remain unetched. After the etching processes, the third intersection portions 612 between the main pattern 202 and the first cut pattern 204 subtracting the first intersection portion 608 are exposed in the patterning-target layer 104 as shown in FIGS. 29A-29B.

Method 700 proceeds to operation 724 by etching the exposed portions of the main pattern 202 in the patterning-target layer 104 using the patterned hard mask layer 110 and the fill layer 650 as etching masks as shown in FIG. 30A. In some embodiments, the one or more etching processes include a selective dry etch process, so that the corresponding portions of the patterning-target layer 104 can be selectively etched to expose a final pattern in the patterning-target layer 104 as shown in FIG. 33A. In some embodiments, the final pattern includes the main pattern 202 subtracting the third intersection portions 612.

In some embodiments, the fill layer 650 is then removed using one or more selective etching processes. In some embodiments, the one or more etching processes include a selective dry etch process, such as a plasma etching process, a selective wet etching process, or a combination thereof, so that the fill layer 650 can be selectively removed, while the patterning-target layer 104 remains unetched. In some embodiments, the hard mask layer 110 is then removed using a CMP process, or one or more suitable selective etching processes. The etching processes may include a dry etch process, such as a plasma etching process, a wet etching process, or a combination thereof. During the etching processes, the corresponding portions of the hard mask layer 110 can be selectively etched, while the middle layer 108 and the patterning-target layer 104 remain unetched. In some embodiments, the middle layer 108 is then removed using a chemical mechanical polish (CMP) method. In some embodiments, the middle layer 108 is removed using one or more etching processes. The one or more etching processes may include a selective dry etch process, such as a plasma etching process, a selective wet etching process, or a combination thereof. During the etching processes, the middle layer 108 is selectively etched, while the patterning-target layer 104 remains unetched.

The present embodiments describe one or more manufacturable and low-cost mechanisms for forming patterns in semiconductor devices using multiple lithography processes. The mechanisms involve forming a combined cut pattern which is a union of a first cut pattern and a second cut pattern in the hard mask layer, trimming the main pattern in the patterning-target layer using the combined cut pattern to form a final pattern. The mechanisms also involve forming a first cut pattern in the hard mask layer, forming a second cut pattern having a first intersection portion with the first cut pattern, etching the middle layer using the first intersection portion to form a second intersection portion between the main pattern and the first intersection portion, and forming a final pattern using the main pattern and the second intersection portion. The mechanisms also involve forming a first cut pattern in the hard mask layer, forming a second cut pattern having a first intersection portion with the first cut pattern, etching the middle layer using the first intersection portion, forming a fill layer to fill the open areas, removing the portions of the fill layer above the hard mask layer to expose a third intersection portion in the main pattern, removing the third intersection portion of the main pattern to form a final pattern using the main pattern and the third intersection portion. The mechanisms enable forming patterns having a size that can be less than the minimum pitch value. The mechanisms also enable forming patterns in a semiconductor device with large-sized and/or complex shapes that are difficult to form using a single lithography process. The mechanisms further enable forming dense patterns in the final pattern. The mechanisms enable forming patterns in a semiconductor device with sharp and clear edges and free of "rounding issues".

The present disclosure provides a method for forming patterns in a semiconductor device. In accordance with some embodiments, the method includes providing a substrate and a patterning-target layer over the substrate; patterning the patterning-target layer to form a main pattern; forming a middle layer over the patterning-target layer and a hard mask layer over the middle layer; patterning the hard mask layer to form a first cut pattern; patterning the hard mask layer to form a second cut pattern, a combined cut pattern being formed in the hard mask layer as a union of the first cut pattern and the second cut pattern; transferring the combined cut pattern to the middle layer; etching the patterning-target layer using the middle layer as an etching mask to form a final pattern in the patterning-target layer. In some embodiments, the final pattern includes the main pattern subtracting an intersection portion between the main pattern and the combined cut pattern.

The present disclosure provides yet another embodiment of a method for forming patterns in a semiconductor device. In accordance with some embodiments, the method includes forming a main pattern in a patterning-target layer over a substrate; forming a middle layer over the patterning-target layer and a hard mask layer over the middle layer; patterning the hard mask layer to form a first cut pattern; forming a second cut pattern in a first resist layer formed over the hard mask layer; patterning the middle layer through an opening corresponding to a first intersection portion to expose a portion of the patterning-target layer, the exposed portion of the patterning-target layer corresponding to a second intersection portion; and etching the exposed portion of the patterning-target layer using the middle layer as an etching mask to form a final pattern in the patterning-target layer. In some embodiments, the first intersection portion corresponds to an intersection between the first cut pattern and the second cut pattern, and the second intersection portion corresponds to an intersection between the first intersection portion and the main pattern.

The present disclosure provides yet another embodiment of a method for forming patterns in a semiconductor device. In accordance with some embodiments, the method includes forming a main pattern in a patterning-target layer over a substrate; forming a middle layer over the patterning-target layer and a hard mask layer over the middle layer; patterning the hard mask layer to form a first cut pattern; forming a second cut pattern in a first resist layer formed over the hard mask layer; patterning the middle layer through an opening corresponding to a first intersection portion to expose a portion of the patterning-target layer, the exposed portion of the patterning-target layer corresponding to a second intersection portion; forming a fill layer to fill the opening; etching the middle layer using the fill layer and the hard mask layer as etching masks to expose one or more portions of the patterning-target layer; and etching the one or more exposed portions of the patterning-target layer using the fill layer and the hard mask layer as etching masks to form a final pattern in the patterning-target layer. In some embodiments, the first intersection portion corresponds to an intersection between the first cut pattern and the second cut pattern, and the second intersection portion corresponds to an intersection between the first intersection portion and the main pattern.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming patterns in a semiconductor device, comprising:
    providing a substrate and a patterning-target layer over the substrate;
    patterning the patterning-target layer to form a main pattern;
    forming a middle layer over the patterning-target layer and a hard mask layer over the middle layer;
    patterning the hard mask layer to form a first cut pattern such that a portion of the middle layer is exposed within the first cut pattern;

forming a first resist layer directly on the exposed portion of the middle layer such that the first resist layer physically contacts the exposed portion of the middle layer;

patterning the hard mask layer to form a second cut pattern by using the first resist layer as a mask, a combined cut pattern being formed in the hard mask layer as a union of the entire first cut pattern and the entire second cut pattern;

transferring the combined cut pattern to the middle layer; and etching the patterning-target layer using the middle layer as an etching mask to form a final pattern in the patterning-target layer, wherein the final pattern includes the main pattern subtracting an intersection portion between the main pattern and the combined cut pattern.

2. The method of claim 1, wherein the patterning the patterning-target layer to form the main pattern includes:

forming a second resist layer over the patterning-target layer;

forming the main pattern in the second resist layer; and etching the patterning-target layer using the second resist layer as an etching mask to form the main pattern in the patterning-target layer.

3. The method of claim 2, further comprising:

removing the second resist layer using one or more processes selected from the group consisting of a wet stripping process, a plasma ashing process, and a combination thereof.

4. The method of claim 3, wherein the plasma ashing process includes using one or more gases selected from the group consisting of oxygen ($O_2$), carbon dioxide ($CO_2$), nitrogen ($N_2$), hydrogen ($H_2$), and a combination thereof.

5. The method of claim 1, wherein patterning the hard mask to form the first cut pattern includes:

forming a third resist layer over the hard mask layer;

forming the first cut pattern in the third resist layer; and etching the hard mask layer using the third resist layer as an etching mask to form the first cut pattern in the hard mask layer.

6. The method of claim 1, wherein forming the first resist layer directly on the exposed portion of the middle layer includes forming first resist layer directly on the hard mask layer such that the first resist layer physically contacts the hard mask layer.

7. The method of claim 1, wherein the second cut pattern extends along a direction that is perpendicular to a direction along which the first cut pattern extends.

8. The method of claim 1, wherein the main pattern includes a feature of a line.

9. The method of claim 1, wherein at least one of the first cut pattern and the second cut pattern includes a feature of a trench.

10. The method of claim 1, wherein the final pattern includes the main pattern subtracting the intersection portion between the main pattern and the combined cut pattern:

$$F=M-(M\cap(P1\cup P2)),$$

where F is the final pattern, M is the main pattern, P1 is the first pattern, P2 is the second pattern, and the combined cut pattern is the union of the first cut pattern and the second cut pattern.

11. A method for forming patterns in a semiconductor device, comprising:

forming a first pattern in a patterning-target layer over a substrate;

forming a middle layer over the patterning-target layer and a hard mask layer over the middle layer;

patterning the hard mask layer to form a first cut pattern such that a portion of the middle layer exposed within the first cut pattern;

forming a first resist layer directly on the exposed portion of the middle layer such that the first resist layer physically contacts the exposed portion of the middle layer;

patterning the hard mask layer to form a second cut pattern by using the first resist layer as a mask, wherein the combination of the entire second cut pattern and the entire first cut pattern form a second pattern;

transferring the second pattern to the middle layer; and etching the patterning-target layer using the middle layer as an etching mask to form a third pattern in the patterning-target layer, wherein the third pattern includes the first pattern subtracting an intersection portion between the first pattern and one or more of the cut patterns.

12. The method of claim 11, wherein forming the first pattern includes:

forming a second resist layer over the patterning-target layer;

forming the first pattern in the second resist layer; and etching the patterning-target layer using the second resist layer as an etching mask to form the first pattern in the patterning-target layer.

13. The method of claim 12, further comprising:

removing the second resist layer using one or more processes selected from the group consisting of a wet stripping process, a plasma ashing process, and a combination thereof.

14. The method of claim 13, wherein the plasma ashing process includes using one or more gases selected from the group consisting of oxygen ($O_2$), carbon dioxide ($CO_2$), nitrogen ($N_2$), hydrogen ($H_2$), and a combination thereof.

15. The method of claim 11, wherein forming the first resist layer directly on the exposed portion of the middle layer includes forming first resist layer directly on the hard mask layer such that the first resist layer physically contacts the hard mask layer.

16. The method of claim 11, wherein the second pattern is formed in the hard mask layer as a union of the first cut pattern and the second cut pattern.

17. The method of claim 11, wherein the second cut pattern extends along a direction that is perpendicular to a direction along which the first cut pattern extends.

18. A method for forming patterns in a semiconductor device, comprising:

providing a substrate and a patterning-target layer over the substrate;

patterning the patterning-target layer to form a main pattern;

forming a middle layer over the patterning-target layer and a hard mask layer over the middle layer;

patterning the hard mask layer to form a first cut pattern such that a portion of the middle layer exposed within the first cut pattern;

forming a resist layer directly on the exposed portion of the middle layer such that the resist layer physically contacts the exposed portion of the middle layer;

patterning the hard mask layer to form a second cut pattern, a combined cut pattern being formed in the hard mask layer from the entire first cut pattern and the entire second cut pattern;

transferring the combined cut pattern to the middle layer; and etching the patterning-target layer using the middle layer as an etching mask to form a final pattern in the patterning-target layer, wherein the final pattern includes the main pattern as a function of the main pattern and the combined cut pattern, wherein the final pattern includes the main pattern subtracting an intersection portion between the main pattern and the combined cut pattern:

$F=M-(M\cap(P1\cup P2))$, where F is the final pattern, M is the main pattern, P1 is the first pattern, P2 is the second pattern, and the combined cut pattern is a union of the first cut pattern and the second cut pattern.

19. The method of claim 18, wherein forming the resist layer directly on the exposed portion of the middle layer such that the resist layer physically contacts the exposed portion of the middle layer includes forming the resist layer directly on a sidewall surface and a top surface of the hard mask layer such that the resist layer physically contacts the sidewall surface and the top surface of the hard mask layer.

* * * * *